United States Patent
Blumer et al.

(10) Patent No.: US 11,332,942 B2
(45) Date of Patent: May 17, 2022

(54) SYSTEM AND METHOD FOR AUTOMATING CONSTRUCTION AND INSTALLATION OF SURFACES IN CONSTRUCTION

(71) Applicant: Form Robotics, Inc., Vancouver (CA)

(72) Inventors: Benjamin Aaron Blumer, Vancouver (CA); Dain Jameson Dypvik Galts, Vancouver (CA)

(73) Assignee: Form Robotics Inc., Vancouver (CA)

( * ) Notice: Subject to any disclaimer, the term of this patent is extended or adjusted under 35 U.S.C. 154(b) by 224 days.

(21) Appl. No.: 16/516,883

(22) Filed: Jul. 19, 2019

(65) Prior Publication Data

US 2020/0024849 A1 Jan. 23, 2020

Related U.S. Application Data

(60) Provisional application No. 62/700,340, filed on Jul. 19, 2018.

(51) Int. Cl.
*E04F 11/17* (2006.01)
*E04F 11/09* (2006.01)
*G06T 7/49* (2017.01)
*B26D 1/00* (2006.01)
*G01C 15/00* (2006.01)
*G05B 19/4097* (2006.01)
(Continued)

(52) U.S. Cl.
CPC .......... *E04F 11/175* (2013.01); *B26D 1/0006* (2013.01); *E04F 11/09* (2013.01); *G01B 11/02* (2013.01); *G01C 15/00* (2013.01); *G05B 19/4097* (2013.01); *G06F 30/13* (2020.01); *G06T 7/49* (2017.01)

(58) Field of Classification Search
CPC ......... E04F 11/175; E04F 11/09; E04F 11/17; E04F 21/26; G01B 11/02; G05B 19/4097; G06F 30/13; G01C 15/00; B26D 1/0006; G06T 7/49
See application file for complete search history.

(56) References Cited

U.S. PATENT DOCUMENTS

| 7,395,606 | B2 * | 7/2008 | Crampton | G01B 11/03 |
| | | | | 33/503 |
| 8,204,619 | B2 | 6/2012 | Heil | |
| (Continued) | | | | |

OTHER PUBLICATIONS

"Flexijet, Innovation CAD-measurement", "www.flexijet.info" FLEXIJET GMBH, WEEE-Reg.-Nr; de-64256698.
(Continued)

*Primary Examiner* — Charles R Kasenge
(74) *Attorney, Agent, or Firm* — Alpine Patents LLC; Brian Van Osdol

(57) ABSTRACT

A system and method for automating construction that includes collecting a multi-dimensional point cloud measurement of at least one construction structure that includes at least one surface; generating a construction plan from the multi-dimensional point cloud measurement, wherein the construction plan defines an assembly arrangement of a set of parts; from the construction plan, automatically generating a cut list for a subset of parts; communicating the cut list to a cutting device; and at the cutting device, cutting a set of materials according to the cut list.

20 Claims, 24 Drawing Sheets

(51) Int. Cl.
   *G06F 30/13*    (2020.01)
   *G01B 11/02*    (2006.01)

(56) References Cited

U.S. PATENT DOCUMENTS

| | | | | |
|---|---|---|---|---|
| 2001/0017169 | A1* | 8/2001 | Englert | G05B 19/4093 |
| | | | | 144/116 |
| 2008/0235970 | A1* | 10/2008 | Crampton | B25J 13/088 |
| | | | | 33/503 |
| 2010/0242391 | A1* | 9/2010 | Meersseman | E04F 15/02 |
| | | | | 52/309.1 |
| 2010/0243138 | A1* | 9/2010 | Laurent | B44F 9/02 |
| | | | | 156/228 |
| 2015/0005915 | A1 | 1/2015 | Chang et al. | |
| 2016/0001508 | A1 | 1/2016 | Dessel | |
| 2016/0103115 | A1* | 4/2016 | Hamby | G01N 21/95 |
| | | | | 73/618 |
| 2016/0123020 | A1* | 5/2016 | Tarn | B32B 37/14 |
| | | | | 156/64 |
| 2016/0185007 | A1* | 6/2016 | Tarn | B27D 1/00 |
| | | | | 144/346 |
| 2016/0332369 | A1* | 11/2016 | Shah | B33Y 30/00 |
| 2018/0029227 | A1* | 2/2018 | Linnell | B25J 9/163 |
| 2018/0215068 | A1* | 8/2018 | Lehmonen | B27C 5/00 |

OTHER PUBLICATIONS

CIPO Searching Authority, "International Search Report and Written Opinion", PCT/CA2019/051004, dated Oct. 18, 2019.

* cited by examiner

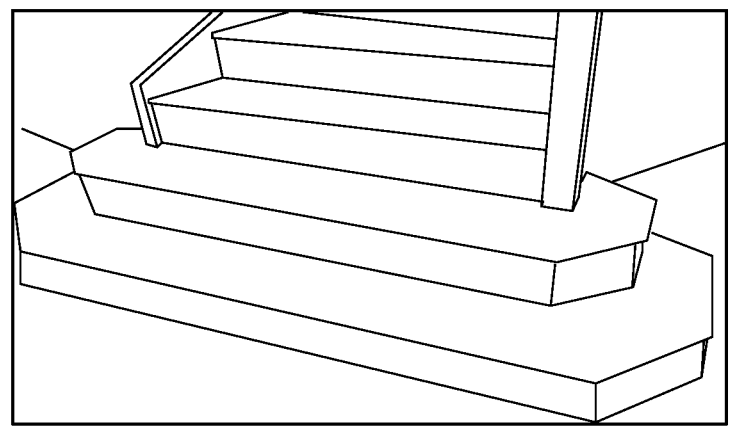
Modeling surfaces of a complex step
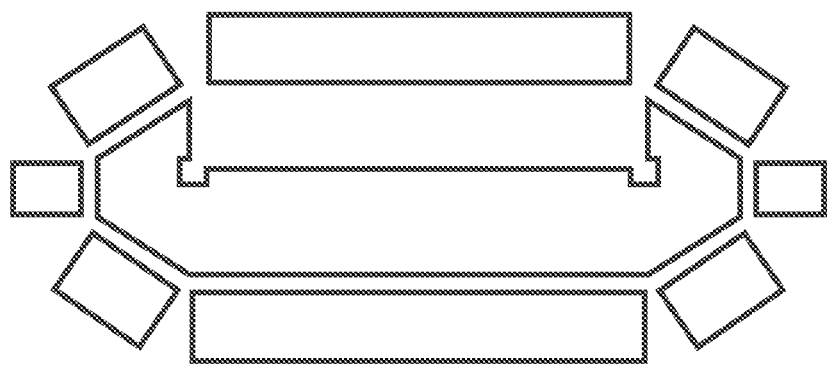
FIGURE 21

Retrieving material processing specifications S210

Retrieving material from an input S220

Feeding the material in between two sets of rollers S222

Actuating material between the two sets of rollers S230

Gripping the material between pairs of rollers S232

Driving at least one roller that is gripping the material S234

Actuating a cutting tool S240

Controlling activation of the cutting tool to process the material S242.

FIGURE 25

SYSTEM AND METHOD FOR AUTOMATING CONSTRUCTION AND INSTALLATION OF SURFACES IN CONSTRUCTION

CROSS-REFERENCE TO RELATED APPLICATIONS

This Application claims the benefit of U.S. Provisional Application No. 62/700,340, filed on 19 Jul. 2018, which is incorporated in its entirety by this reference.

TECHNICAL FIELD

This invention relates generally to the field of semi-automated construction, and more specifically to a new and useful system and method to create and install customizable staircase or flooring.

BACKGROUND

Paneling can be a time consuming and labor intensive task. Surfaces, in general, tend to be difficult to access and measure accurately. Flooring for stairs is particularly tricky as each step needs to be measured, and numerous custom parts manually modified to fit each step. Flooring of the stairs typically consists of three parts: a riser, a piece that extends from the base of a step of the stairs to the top of the step; a tread, a piece that covers a good part of the base of the step and extends into the edge connecting with the next step (and riser); and a lip (also called nosing), a piece that covers the outer edge of the step and sometimes extends outwards from the step to some desired length. Depending on the configuration of surrounding walls, there can be nosing on one, two, three, or even 4 sides of the tread and/or riser.

Although stair steps may look like simple geometric shapes, small imperceptible deviations can have a huge bearing on installing flooring. Imprecise fitting of the flooring can be wobbly, noisy, bulgy and ugly to look at, and even dangerous. Current systems and approaches fail to adequately allow for efficient and precise measurements of each step of a staircase in a user-friendly system. Furthermore, there is no current method to create flooring to fit these precise measurements in an efficient manner and on site.

Thus, there is a need in the field of construction to create a new system and method to efficiently and accurately create and install paneling, particularly flooring for stairs. This invention provides such a new and useful system and method.

BRIEF DESCRIPTION OF THE FIGURES

FIG. 21 is a schematic representation of multiple multi-dimensional point cloud measurements of multiple surfaces of a step;

FIG. 25 is a flowchart representation of a method of a preferred embodiment for operating a continuous material-fed cutting device.

DESCRIPTION OF THE EMBODIMENTS

The following description of the embodiments of the invention is not intended to limit the invention to these embodiments but rather to enable a person skilled in the art to make and use this invention.

1. Overview

Figure 1:
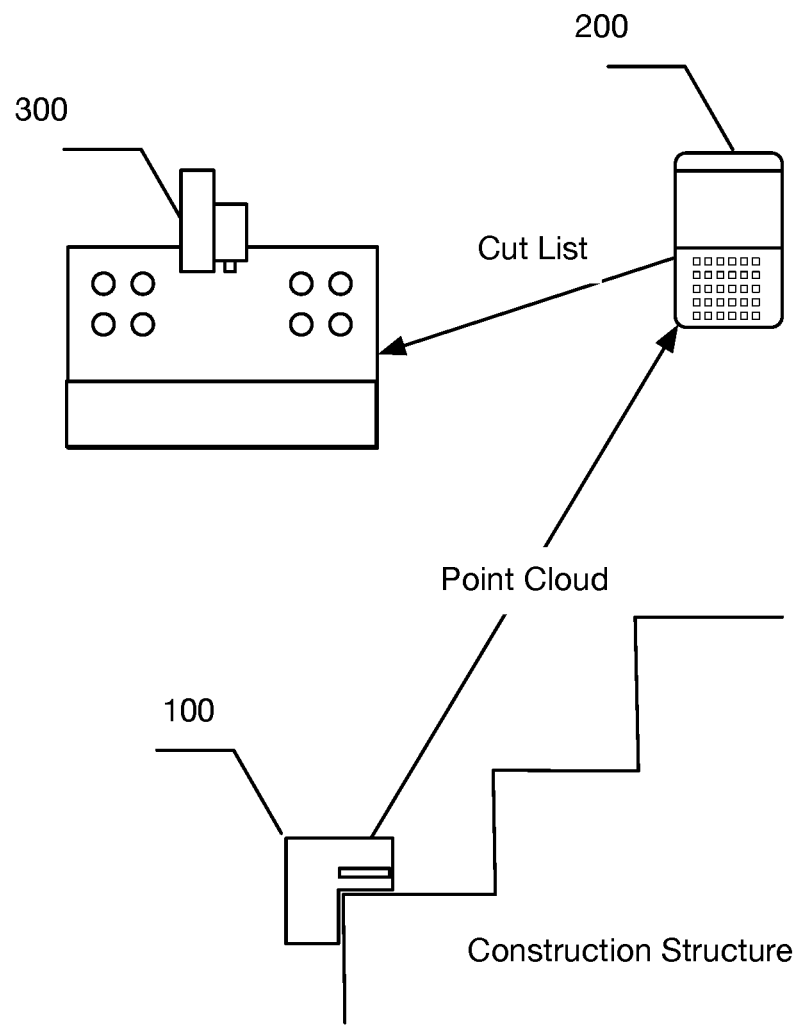
FIG. 1 is a schematic representation of a system of a preferred embodiment.

As shown in FIG. 1, a system and method for creating and installing customizable panels, of a preferred embodiment, functions to quickly measure the surface of the desired region, and subsequently design construction plans and cut pieces of material into installable paneling and parts that are based on the measured surfaces. The systems and methods used in creating and installing customizable panels can include a measuring device that can accurately and quickly measure the desired region; a designating system that manages construction plans, part lists, assembly plans, and can enable user customization; and a cutting device that cuts the material pieces to designated specifications in an at least semi-automated manner.

The system and method can facilitate an improved construction process for many types of construction projects. The system and method can have particular applicability to construction scenarios that involve projects involving fitted assembly of multiple parts. Such construction projects can involve the assembly of panels to cover a surface. The system and method are particularly applicable for the precise measurement of tread and riser surfaces of a staircase. The tread and riser surfaces can be measured to a high level of precision (e.g., less than 2 mm or even less than ½ mm of error) and then used in designing and producing custom installation materials. The system and method may be further implemented in the general case to measure, plan material resources, and cut material pieces to specification. In some cases, the materials can include pre-fabricated uniform materials such as of tongue-and-groove or snap lock planks cut to standard lengths. Other exemplary applications can include, but are not limited to, creating and building customizable: flooring, cabinets, counter tops, tables, house siding, trim, window frames, tables, wall framings, and beds.

Beyond paneling, the system and method may additionally be implemented as a general portable carpentry device. The system and method has a large range of implementations to allow for semi-automatic measurement, planning, and cutting in many carpentry applications.

A potential benefit of the system and method is a streamlined user experience in creating and customizing plans with minimal need for additional tools and external support. The system and method may allow for the user, while on location with no additional tools, to measure potentially complex surfaces, plan and allocate resources during and/or directly after measuring, and cut material pieces to specifications. In other variations, the system and method may allow for a user to measure complex surfaces and then a customized construction kit could be produced offsite by a remote cutting machine and/or operator.

In some variations, another potential benefit of the system and method is the quick and efficient manner in which dimensions of an installation region can be measured; particularly so for staircases. The measuring device may be designed to measure the tread or riser of the step by just placing a measuring device directly on the step in a specific fashion. Measurement of both tread and riser of a single step may be made with minimal adjustment of the measuring device and may be done without moving the measuring device. Thus, measurement of each step would take seconds at most.

Another potential benefit of the measuring device of the system and method is the accuracy of measurements. Some variations of the measuring device can make use of a laser scanner that can measure and create an accurate two-dimensional array of the tread and riser of each step. These two dimensional arrays may be accurate to sub-millimeter accuracy and significantly more accurate than a typical measurement made of a step.

Another potential benefit of the measuring device of the system and method is that it may be able to detect and measure three-dimensional imperfections of a surface. In addition to measuring the precise two-dimensional features of a surface, the measuring device may additionally measure three-dimensional details of a surface, which can reveal surface imperfections of a base structure that can be addressed during the design and production of custom parts.

Another potential benefit of the system and method is the ease of planning of the designating system. The designating system may keep track of all material for a stair project. After all measurements of the project are made, the designating system may automatically determine and allocate how pieces should be cut. Automatic allocation may allow for efficient and easy planning of the project and help minimize material waste.

A further potential benefit of the designating device of the system and method is to ease and streamline project management. The designating device may keep track of multiple stair projects and different sets of material. A user may "mix-and-match" material sets and stair projects, allowing the designating device to optimize allocating material and keep track of remaining inventory.

Another potential benefit of the system and method is the portability of the cutting device. The cutting device may be small and portable enough to carry on site, and can, to a high level of precision, cut material pieces on site for quick installation. In terms of portability, one preferred variation of the cutting device has a roller-based material translation approach that can accommodate very long material lengths (e.g., five feet, ten feet, twenty feet or more) where the material length can be significantly larger than the cutting device itself. This can be particularly useful in home and building construction projects involving wooden plans or parts with long aspect ratios. This may be a huge benefit in cost and time particularly compared to having to cut pieces at a different location.

Another potential benefit, of the cutting device of the system and method can be its clean operation. The orientation of the cutting tool in the cutting device and the construction of the device can be such that machining debris can be isolated to a region and captured in a container. This can make the cutting device more convenient for use on-site and indoors.

Another potential benefit of the system and method is the ease of use. Many flooring installers will not install stair flooring because of the difficulty of measuring stairs and cutting boards to size. Installers may have to bend over hundreds of times to measure and re-measure an entire staircase accurately, which can even impact their physical health. The system and method may allow for a single set of accurate measurements to be made of an entire staircase, reducing the need for re-measuring and minimizing the need to bend over multiple times.

The system and method are preferably applied in the areas of construction. Contractors may utilize the system and method to help build, modify, or repair steps and stairs, but may additionally be applied to the construction or modification of other piecewise objects. The system and method may be utilized independently or may be part of an alternative project.

2. System to Create and Install Paneling

As shown in FIG. 1, a system to efficiently and accurately create and install paneling of a preferred embodiment can include a measuring device 100, a designating system 200, and a cutting device 300. The system functions to measure a desired region and prepare customized panels matching the measurement specifications of the desired region. The system is preferably implemented to prepare panels for staircases and flooring, but may be implemented in other paneling use cases, such as creating cabinetry, wall panels, and fencing. As desired, the measuring device 100, the designating system 200, and the cutting device 300 can each have unique properties and may be used independently or as part of a coordinated implementation.

The desired region of a preferred embodiment comprises of a single surface or multiple surfaces. Each surface is primarily two dimensional in character in Cartesian coordinates. That is, each surface may be primarily described using two dimensions (e.g., the floor of a room) as to describe perimeter of a surface or structure that can be paneled. A third dimension may still make some contribution to the contour of the desired region but will preferably have a less significant role as compared to the first and second dimension. For example, the floor of a room, regardless of shape, is generally described by defined shape in x and y dimensions. But the floor may be uneven (e.g., due to deformities) that add height fluctuations, adding a z-dimension. In the variation where there are multiple surfaces modeled. The system can preferably track, model, or sense arrangement of the different surfaces in relation to each other. In the exemplary use case of stairs, adjacent surfaces that join at angles will generally define the construction structure of a stair or a staircase. For example, a riser and the tread define two surfaces that generally meet at a perpendicular or substantially perpendicular angle (i.e., 80-100 degrees). Although the system and components of the system may additionally handle complex three-dimensional structures, the desired region refers to surfaces that are primarily two dimensional in nature. Examples of preferred desired regions correspond to preferred implementations of the system, and may include, staircases (e.g., for paneling staircases), floors (e.g. for flooring), walls (for wall paneling or building cabinetry for a room).

In some implementations, boundaries of the desired region are not clear (e.g., a staircase with no walls on either side, or half a room). In these implementations the system may additionally include a marking device to delineate the boundary of the desired region. In one variation for a staircase, the marking device includes jigs to be placed at the sides of each step. In a second variation, the marking device includes tape that is placed along the desired region boundary.

The measuring device 100 of a preferred embodiment functions to measure a desired region, or set of regions. The measuring device 100 is a tool that can be placed on or near the desired region to measure that region. In preferred variations, the measuring device 100 scans the desired region with an integrated sensor and creates a point cloud measurement representation of the surface of the region. The point cloud measurement can represent measured points that characterize a two dimensional representation of defined perimeter of a construction surface. The point cloud measurement may additionally or alternatively represent measured points that characterize three-dimensional measurements of the exposed construction surface (e.g., defining internal structure in addition to perimeters). The measuring device 100, or another component of the system, may then generate a 2D or 3D model of the desired region using the point cloud representation. Examples of techniques that the measuring device may use include, but are not limited to: stereo triangulation, sheet of light triangulation, structured-light scanning, interferometry, and coded aperture imaging.

In preferred variations, the measuring device 100 does not just measure the height, width, and length dimensions of the desired region, but may measure any aberrations from that surface. In this manner, the measuring device 100 may create a two- or three-dimensional profile of the desired region that is precise to at least sub-millimeter accuracy.

The measuring device 100 may be fully automated, manually controlled by a user, or partially automated. The measuring device 100 may have a communication system that can send measurement details to other devices as necessary. The measuring device 100 may be mechanical, electronic, or of some other nature.

Figure 2A:
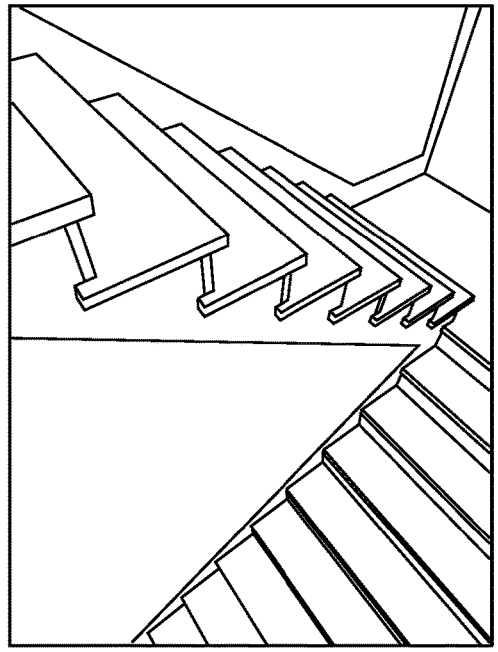
FIGS. 2A-2C are schematic representations of exemplary complex staircase designs that may be addressed by the system and method.
Figure 2B:
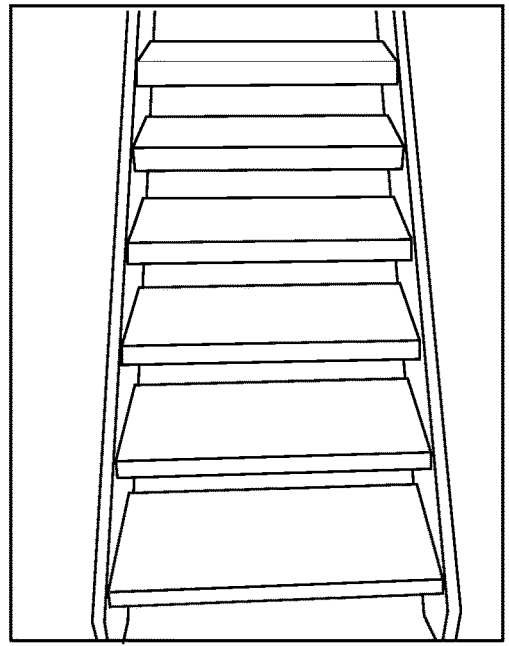
Figure 2C:
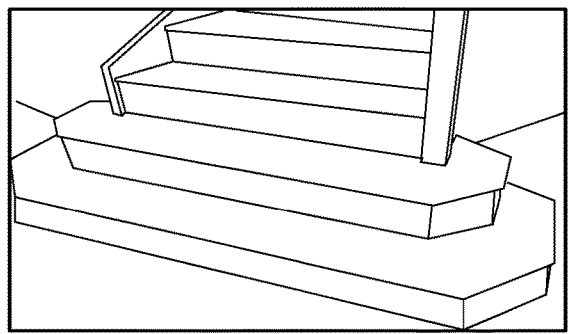

Dependent on the size of the desired region and the implemented measuring device 100, the measuring device may be able to measure the entire desired region from a single location. In some instances of use, the measuring device 100 may have to be moved, or adjusted, to measure an entire desired region. For example, for a desired region that is a set of stairs, the measuring device may have to be moved to each step of the stairs to measure the tread of the step, and the measuring device may have to be adjusted to measure the rise of the step. Another example, for a particularly large step of a staircase, the measuring device 100 may have to be moved from one position of the step to another position of the step to completely measure the entire step. As shown in FIGS. 2A, 2B, 2C, more complex staircase may have overhanging portions of a tread, landings, floating treads, non-regular tread surfaces, and/or other custom features. The measuring device can be used in collecting appropriate surface measurements. In some cases, different portions of a tread and/or riser surface are captured in separate scans and unified into a single surface.

The measuring device 100 may have multiple variations, which may, or may not be implementation dependent. In one preferred variation, the measuring device 100 is a coordinate measuring machine (CMM) arm. In another preferred variation, the measuring device 100 is a stair-edge oriented scanning measuring device configured specifically for scanning stairs. In a third variation, the measuring device 100 may comprise a mechanical arm that extends to span the desired region. In a fourth variation, the measuring device 100 is a scanning laser. In a fifth variation the measuring device 100 comprises a video camera. Alternatively, the measuring device may take any desired form that can scan the desired region to generate a 2D or 3D mapping of the region. Additionally, some variations of the system may make use of multiple sensing approaches.

In one preferred example, the measuring device 100 is a coordinate measurement machine (CMM) arm. The CMM arm, or an equivalent actuated device, preferably can be moved or actuated into position to record a set of points of an object where the set of points can be combined to form a point cloud or a similar representation of the structure. The CMM arm can be used to trace the perimeter of a structure for a 2D or 3D shape profile of the construction surface. The CMM arm may alternatively be traced over multiple points on the surface to get a surface elevation profile in combination with a shape profile. In one example, the tip of the CMM arm may be extended to physically trace the surface of the desired region. In another preferred example, the CMM arm emits a wave, electromagnetic (e.g., visible light, microwave, radio wave, infrared, etc.) or pressure wave (e.g., sound wave from ultrasound) directed at the desired region. Electromagnetic (EM) waves may be a coherent beam(s) (e.g., laser(s)) or non-coherent EM waves, of any desired wavelength(s) or desired spectra (e.g., visible light). Through reflection, and/or scattering, of the emitted wave, the CMM arm may create the point cloud representation of the desired region.

In the second preferred example, the measuring device 100 is a scanning measuring device that includes a scanning depth sensor, preferably an optical/laser depth sensor. Alternatively and/or additionally, the scanning measuring device may include an alternative sensor that uses transit-time measurement (e.g., ultrasound, radar). The scanning measuring device can be positioned on or near the surface and then the scanning depth sensor collects a series of measurements from that position. The scanning measuring device can be partially or fully automated. The scanning actuator coupled to the scanning depth sensor can be configured to actuate the scanning depth sensor across a range of angular positions. In some variations, the measuring device 100 includes multiple scanning sensors.

Figure 3:
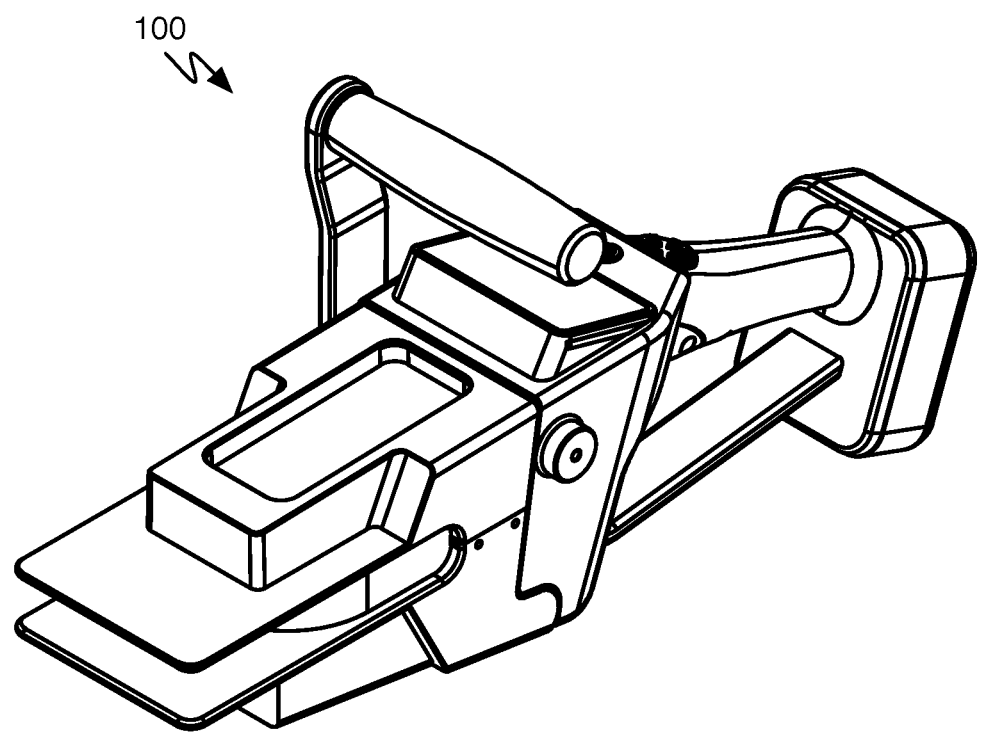
FIG. 3 is an exemplary model of a mechanically operated measuring device.

In the use case of stairs, a scanning measuring device can be a stair-edge oriented (SEO) scanning measuring device. The SEO scanning measuring device preferably calibrates position to an intersection of a riser and tread surface. A SEO scanning measuring device can structurally include a body, with a defined inset corner, that functions to physically couple with the edge of a stair (i.e., where the front of the tread meets the top of riser) such as the exemplary design shown in FIG. 3. In the inset corner variation, the scanning occurs inward across the tread to the next riser and/or down a riser to a tread surface below. Alternatively, the scanning may occur outward across the tread and/or up a riser to the tread above. In an alternative variation, the SEO scanning measuring device includes a body with a defined protruding corner to physically couple with a stair corner (i.e., where the back of a tread meets the bottom of a riser). In the protruding corner variation, the scanning occurs outward across the tread and/or up a riser.

Figure 4:
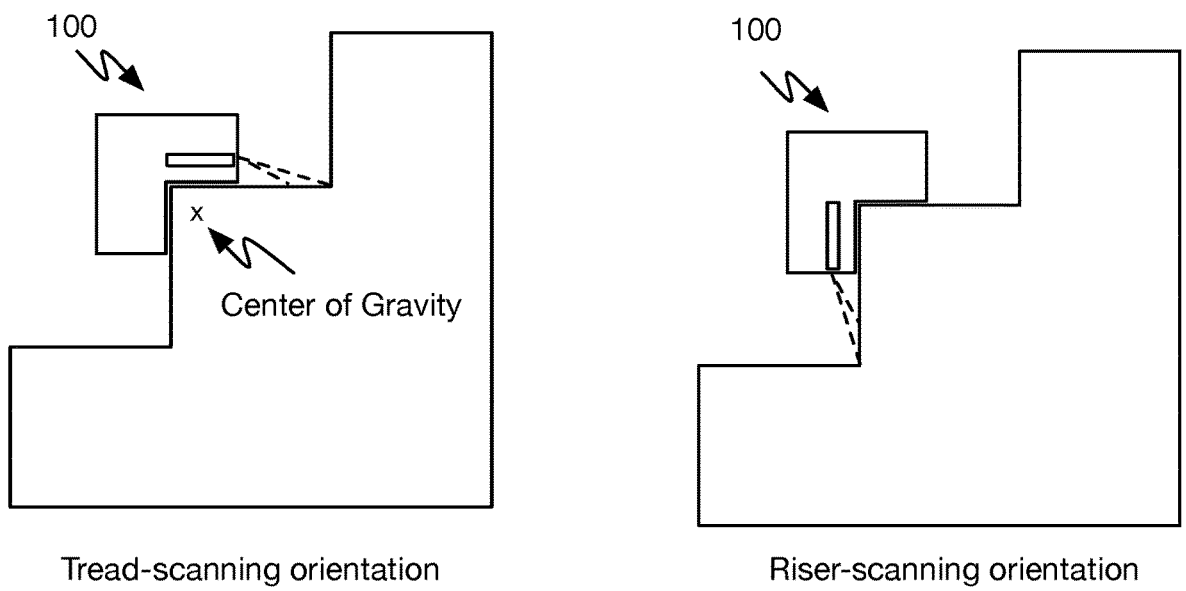
FIG. 4 is a schematic representation of one variation of a stair-edge oriented scanning measuring device in different orientations.

In one variation, the SEO scanning measuring device can be designed to scan a selected surface: a tread surface or a riser surface. In this variation, the SEO scanning measuring device can have an inset corner and structure configured to orient the center of gravity within the cavity defined by the inset corner. The configured center of gravity functions to allow the SEO scanning measuring device to be stably rested on the corner of a stair in two different orientations: a tread-scanning orientation with the scanning sensor pointed forward to measure the step tread and a riser-scanning orientation with the scanning sensor pointed downward to measure the stair riser as shown in FIG. 4. During use, the SEO scanning measuring device may be placed on a staircase step in a manner to allow the scanning sensor to make a detailed two-dimensional measurement of one of the risers and/or the tread. The SEO scanning measuring device can then be rotated to scan the other surface before moving to the next stair edge.

Figure 5A:
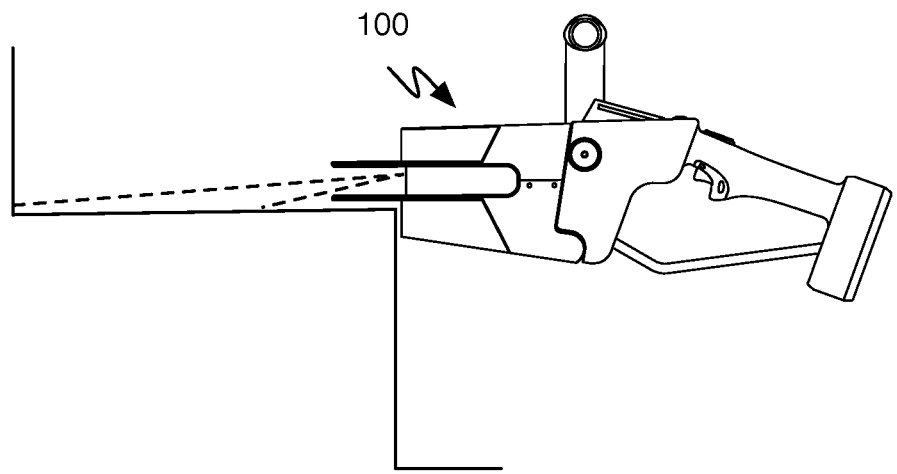
FIGS. 5A and 5B are schematic representations of a stair-edge oriented measuring device in two selectable modes for measuring a tread or riser.
Figure 5B:
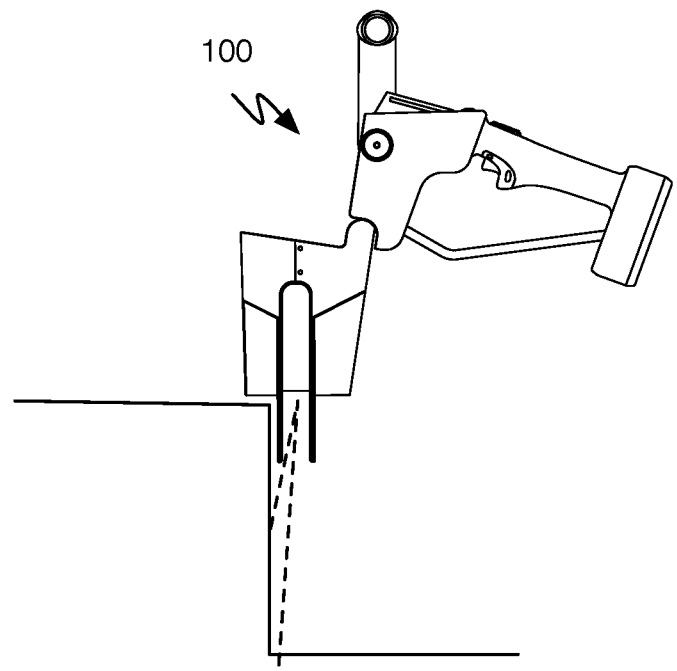
Figure 26:
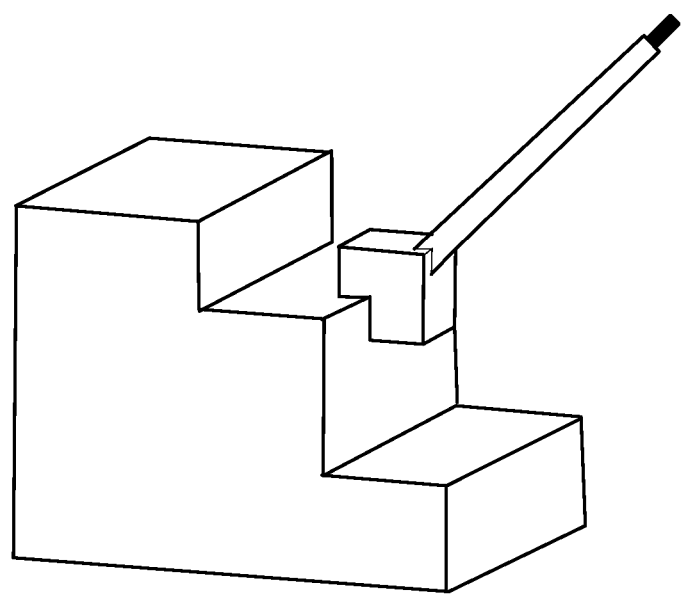
FIG. 26 is a schematic representation of a stair-edge oriented scanning measuring device that includes an extended handle.

In some variations, the SEO scanning measuring device can include a scanner sensor with a selectable orientation. In other words, the scanning sensor can be rotatable between at least two scanning positions. Selectable orientation can be motor driven or controlled through manual manipulation of a physical mechanism (e.g., lever, hinge), and functions to allow a tread and riser to be scanned by a single scanning sensor for only one position of the SEO scanning measuring device. This variation may avoid manual rotation of the SEO scanning measuring device as it sits on a stair. In one implementation, the measuring device may have a bending or rotating joint allowing the measuring device to quickly transition between measuring the riser and/or the tread of each step of the staircase. In another implementation, as shown in FIG. 26, the SEO scanning measuring device may have an extended handle. The extended handle may allow a user to rotate the SEO scanning measuring device to switch between measurement of the tread as shown in FIG. 5A and the riser as shown in FIG. 5B. Alternatively, the scanning sensor may rotate internally; the SEO scanning measuring device may include two scanning sensors oriented at perpendicular directions; and/or the device could be physically rotated about the handle to change the orientation of the device. Additionally, the extended handle may enable a user to place and lift the SEO scanning measuring device without the need for a user to repeatedly bend down to move the SEO scanning measuring device between each step.

In the case of flooring, counters or large construction surfaces, a scanning measuring device may be one that includes a 360° scanning depth sensor, which functions to scan visible perimeter of the surface. This measuring device may be used by executing a scan from somewhere in the middle of the surface. Multiple scans can similarly be unified to form a full scan of the surface.

Figure 6:
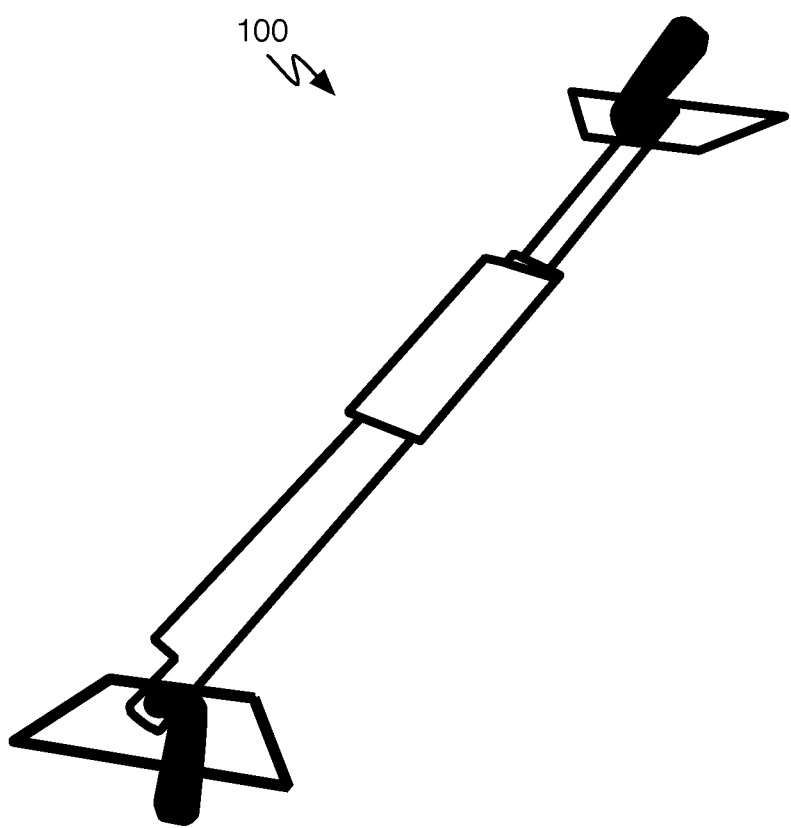
FIG. 6 is an exemplary model of a mechanical measuring device.

In the third preferred variation, the measuring device 100 may comprise a mechanical arm, as shown in FIG. 6. The mechanical arm is preferably manually driven, and mechanically operated to measure stairs. In one implementation of the mechanical arm for use with stairs, the mechanical arm includes two angular alignment pieces rotatably mounted on the two ends of a longitudinal piece. An angular alignment piece functions to measure angle or a face on one side. The longitudinal pieces can be longitudinally adjustable to measure length. The mechanical measuring device can use linear encoders, rotational encoders, and/or other select sensing systems to generate digital measurements from a substantially mechanically driven device. The mechanical arm may additionally have two feet that can be stretched to the ends of a step to measure the latitudinal dimension of the step.

As mentioned, the measuring device 100 may include a communication system that functions to transfer measuring information to the designating system 200. The communication system can send information through a direct connection, Bluetooth, IR, Wi-Fi, a hard cable connection, or through any other communication channel that would allow efficient and robust information transfer. Transferred information may include raw data, to be processed, to determine the measurements of the desired region, or may include the processed measurements of the desired region.

The designating system 200 of a preferred embodiment functions to manage construction plans, part lists, assembly plans, and can enable user customization. The designating system 200 preferably translates a measuring input from the measuring device 100 into a part list and assembly plans. The designating system is 200 is essentially a processing unit with a user interface.

The designating system 200 may function as an application on a personal computer, phone, or other electronic device; may be a web-based system, an independent system connected to another device of the system, an independent computing device; or the designating system 200 may take any other form that can accomplish the task of a designating system. In some embodiments, the designating system 200 is a computing device on, or part of, another system component (e.g., measuring device 100 or cutting device 300). Alternatively, the designating system 200 may have subcomponents on one or more other system components (e.g., user interface on cutting device 300). The designating system 200 may be fully automated and determine paneling construction plans with no user input. The designating system 200 preferably facilitates a number of construction optimizations used to satisfy various construction conditions. For example, the designating system 200 can manage centering panels and altering arrangement of individual panels to avoid non-ideal cuts or positions (e.g., avoiding an arrangement where one panel is specified to be cut extremely thin to fit in a gap). In some variations, the designating system 200 can include a construction planning user interface (UI) for user input and interaction.

Figure 7:
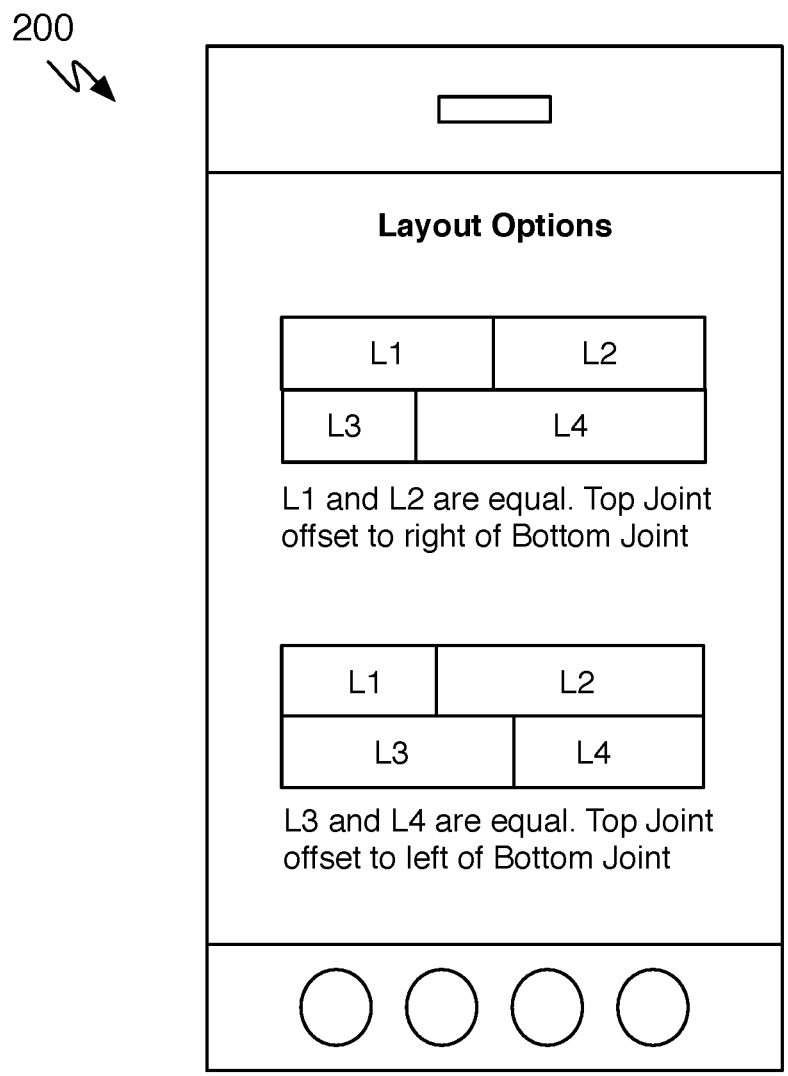
FIG. 7 is an exemplary schematic of layout options presented to a user in a user interface.
Figure 8:
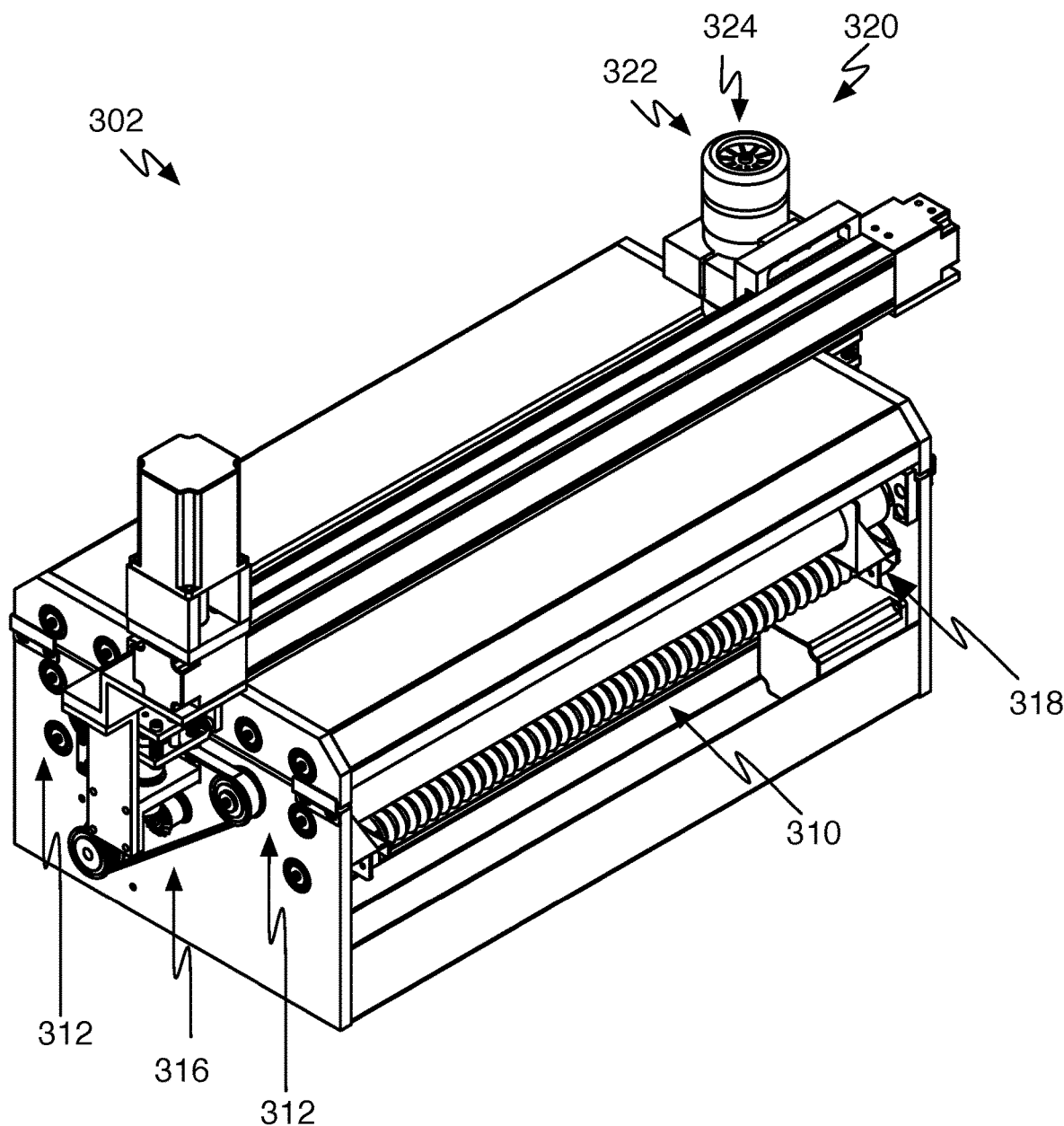
FIG. 8 is a schematic representation of an isometric view of a continuous material-fed cutting device.
Figure 9:
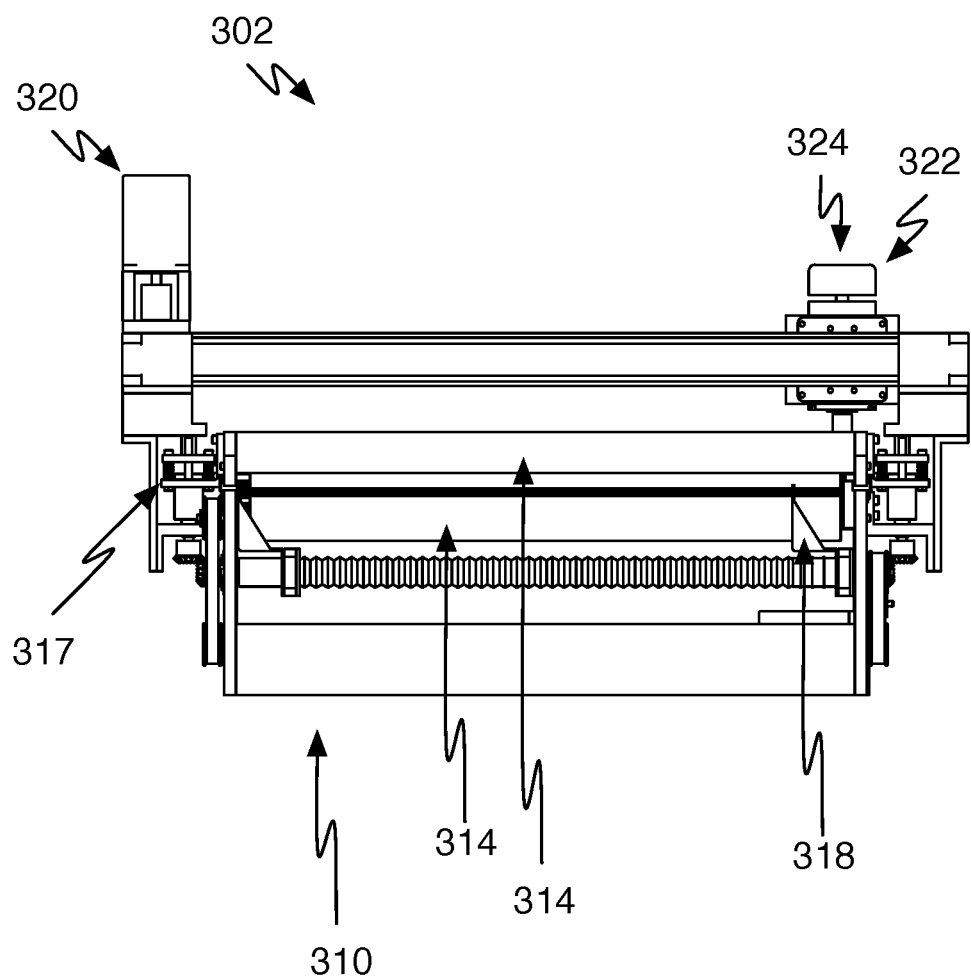
FIG. 9 is a schematic representation of a front view of a continuous material-fed cutting device.

The construction planning UI functions to enable a user to review and possibly edit the construction plans. The construction planning UI may allow the user to view all measurement and material information for a particular construction project. In one variation, the construction planning UI can provide layout options. Selection of a layout option can alter the construction plans. Additionally, the construction planning UI may provide options for other customizations or production preferences. There may be a number of layout patterns from which the user may select. The layout patterns can be automatically generated following guidelines of typical layouts. Layout option properties may additionally be selected/configured to customize an automatically generated layout. A manual or semi-manual layout option may additionally exist. As shown in the example in FIG. 7, a user could select between two options where the board lengths vary, and the relative joint position is different. The construction planning UI may additionally allow the user to create a layout of how material should be allocated and cut, allow the user to intercede and change allocations made by the designating system 200, provide guidelines for the designating system 200 to follow when making allocations, and/or allow the user to manually allocate all resources. For example, the user may designate that higher quality board pieces should be used at the bottom of the staircase, or that the designating system 200 should ignore any restrictions on knots in pieces of boards when the designating system makes cut and placement designations. The construction planning UI may allow additional functionality as per a project/contract manager. That is, the construction planning UI may include information about multiple staircases, cost of projects, cost of materials, material inventories, allow the allocation of a set of material for a specific project, direct connection to buy material and other resources. The construction planning UI may have some, all, and/or additional features independent of staircase projects.

The designating system 200 may additionally include a job and material database. With a job database, the designating system 200 may receive and store information about one or more jobs (e.g., specific step details about a staircase). Job information preferably includes dimensions of the desired region, more preferably dimensions of each surface of the desired region. For example, for a desired region that is a floor, the designating system 200 may receive the dimensions and profile of the floor; and for a desired region that is a staircase, the designating preferably receives the profiles and dimensions of each tread and riser of the staircase. The profile can preferably capture and characterize the (typically) non-linear edges of a surface. Walls are generally not perfectly straight or aligned at perfect right angles. The profile preferably characterizes such small variations.

With a material database, the designating system 200 may receive and store information about "available" material. Available material may be material for a specific job and/or generally inventory material. Material information may include, but is not limited to: material type (e.g. Douglas fir, granite, carbon fiber), joining system used by the material (i.e. how multiple pieces of material are attached together, e.g. tongue and groove for wooden cabinet panels), available material quantity, dimensions of each piece of material, specific material properties (e.g., elasticity). For an example where the material comprises a set of pine wood boards, the material information may then comprise "pine wood", the number of available boards, and the dimensions of each board. Additional material information may also be included, such as knots in the boards that need to be cut around.

The designating system 200 may additionally have a channel designated to gather product information. Product information may be given to the designating system manually through the channel and/or may be obtained by the channel in an automated or semi-automated fashion. In some variations, the channel includes a product input function. The product input function may be utilized with the purchase of material (e.g., a package of wood boards). Scanning the package would give the designating system some and/or all relevant information about the material. In one example, the product input function may be able to read the store barcode and gather all pertinent information from the store barcode. With the stored product information and stored measurements, the designating system may contain a feature to calculate the cost of a specific project and/or to calculate the cost of the project using different types of materials.

The designating system 200 may additionally upload stored information for use by other designating systems or other devices as seen fit. Additionally and/or alternatively, the designating system may download general information or "cutting" information. This downloaded information may contain cutting specifications that may further be edited, implemented with the cutting device, stored, or used in any other desired fashion.

The cut list is preferably an output component of the designating system 200. The designating system 200 may use the job information and the material information to determine how to cut and allocate each material piece. The cut list comprises information on how to cut and allocate each material piece for a specific job. The cut list functions as a designation of how each material piece is cut and placed in the desired region. Combining the staircase job example with the pine wood material example, the cut list contains the information regarding how each pine wood board should be cut and placed to floor the entire staircase. Additional information may be incorporated in the cut list. For example, the designating system 200 may additionally take into account knots and other material flaws to avoid, or cut around, when allocating material; wherein this information would be factored into the presented the cut list. Examples of other material information that can be included in the cut list include: the material thickness and material type. As described for customization, using the construction planning UI, the cut list may be based on user input and various options selected in the construction planning UI.

In some variations, the designating system 200 may include a part identification module that maps an identifier to an individual part. In one variation, the part identification module is used in generating labels that can be affixed to parts. The labels can be used to communicate the part identity to a user, but may additionally or alternatively signal the part/material identity to the cutting device. In another variation, the part identification module is used in defining how parts are labeled during or after the cutting process. In some variations, the cutting device 300 can be configured to apply the label to a part during the cutting process. Alternatively, a separate marking tool may label each piece of material with the relevant information for that piece. The label itself may be a sticker, burn, etching, writing, an alternative form of demarcation, and/or any relevant combination.

The designating system 200 may additionally include an assembly UI that functions to guide a user in the assembly of the construction plan. In one variation, step-by-step instructions can be automatically generated from the construction plans. In one variation of an assembly UI, a user can search for a part identifier within a user interface, and the part is highlighted in a graphical map of the assembly plans.

The cutting device 300 of a preferred embodiment functions to cut the material pieces to the desired specifications as they are passed through the cutting device. The cutting device 300 preferably includes a motorized maneuverable cutting tool and/or a material translation system such that parts can be cut to specification. Preferably, the cutting device 300 has at least two degrees of freedom and is capable of cutting 2D forms through computer numerical control of the maneuverable cutting tool and/or material translation system. More preferably, the cutting device 300 has three degrees of freedom and is capable of cutting 3D forms.

The cutting device 300 is preferably capable of manipulating materials in a variety of ways.

In one example, the cutting device 300 may cut a longitudinal piece of material to a specified length (e.g., cutting a plank or panel from three feet to two).

In another example, the cutting device 300 may cut a longitudinal piece of material to a specified width (e.g., cutting a plank down its length such that it is two inches wide instead of four inches).

In another example, the cutting device 300 may cut out a shape of a part from a large piece of material.

In another example, the cutting device 300 may cut along the surface of a part, which may function to create a top and bottom surface of a plank that are non-parallel. This may be used for creating a shim. More interestingly, a material could be cut with complex surfaces. This may be used to create complex shims that more closely map to a construction surface or to account for non-perpendicular walls.

In other examples, the cutting device 300 may also cut angles, cutouts, non-linear paths (e.g., cutting a plank with a curved edge to fit against a curved wall), mill grooves, and make other suitable modifications to materials.

In a preferred variation, the cutting device 300 is a continuous material-fed (CMF) cutting device 302. A CMF cutting device 302 is preferably one that is roller-fed (i.e., a roller-fed cutting device) wherein material is held and moved linearly along one axis by rollers to facilitate positioning of where a cutting tool modifies the material. The CMF cutting device 302 can be particularly useful in cutting objects with large aspect ratios (i.e., long items) while keeping the footprint of the device small. The CMF cutting device 302 may additionally have wider applications outside of paneling construction. Additionally, the CMF cutting device 302 can be further augmented with additional machining capabilities such as additional axes of actuation (e.g., adding 1-3 rotational axes of rotation to a cutting tool head and/or the material feed). The CMF cutting device 302 can be distinctly used for a wide variety of applications. While the CMF cutting device 302 is described in the context of application for paneling, the CMF cutting device 302 may be implemented independently and separately from other aspects of the system.

The CMF cutting device 302 preferably has the ability to cut pieces of material many times the size of the CMF cutting device 302. FIGS. 8-11 are schematic representations of one preferred example of a CMF cutting device 302. The CMF cutting device 302 may have the ability make cuts on all four sides of the material being passed through. The CMF cutting device 302 may additionally also cut above and below the material, shave a slope, shave interior regions of the board face, and make inlays and engravings. In some variations, the board may have to be removed and rotated to cut "above" and "below" the material, while in other variations the cutter may automatically move to those regions. The cutting device is preferably semi-automated. That is, a user may be needed to load material and aid the material to pass through the cutting device, while the cutting device itself will cut the material up to the desired and/or planned specification without any additional user input. In preferred variations, once the material to be cut is loaded into the CMF cutting device 302, the cutting device will automatically move the material as necessary to manipulate the material (e.g., cut the material).

In preferred variations, the CMF cutting device 302 is a portable "box-like" device that can cut material. The CMF cutting device 302 preferably has a defined central cavity through which material is fed. There will generally be a width and height limitation to material based on the width and height of the defined cavity. However, the cavity can be any suitable size. As a continuous material-fed cutting device, the CMF cutting device 302 may be able to process materials that have large length profiles such as planks. Supports could be used on either side of the cavity to support weight material when extending outside the CMF cutting device 302.

The CMF cutting device 302 includes a roller material-feed system 310 that holds and guides material through the CMF cutting device 302, and a cutting tool 320 that cuts the material. Additionally, the CMF cutting device 302 may include: a vision system 330 and/or a material supply system 340. For portability and in home use convenience, the CMF cutting device 302 may additionally include a waste tray 351 and debris curtains 352. The CMF cutting device 302 is preferably a portable device that can be carried or otherwise moved into buildings. The CMF cutting device 302 may include a communication system, user interface system, and/or other suitable computing components.

The roller material-feed system 310 functions to hold and guide materials back and forth along one defined linear axis such that the cutting tool 320 may modify the material. The roller material-feed system 310 is preferably designed to handle rigid material such as wood paneling, planks, sheet metal, and the like. The roller material-feed system 310 preferably includes a set of rollers 314 oriented in an array with one subset of rollers 314 aligned with a material-facing surface on a first defined plane and a second subset of rollers 314 aligned with a material-facing surface on a second defined plane. The material will be gripped between the material-facing surfaces of these two "layers" of rollers 314 such that a material can be rolled back and forth between the rollers. The rollers 314 are preferably clamped such that they hold the material tightly. At least a subset of the rollers 314 are actuated such that the position of the material along a defined material feed axis is controlled.

Figure 12:
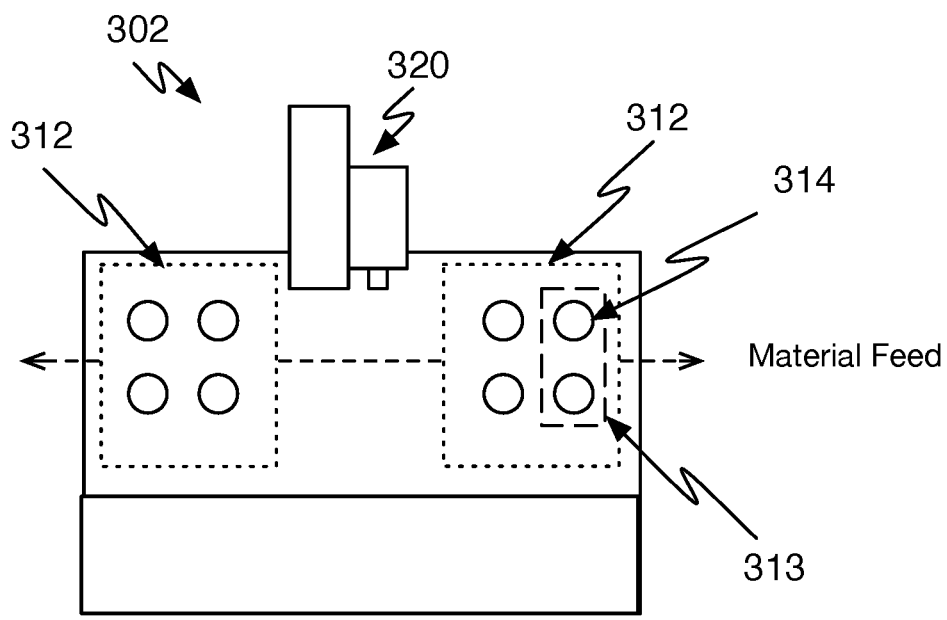
FIG. 12 is a schematic representation of a side view of roller configuration of a roller material feed system.
Figure 13:
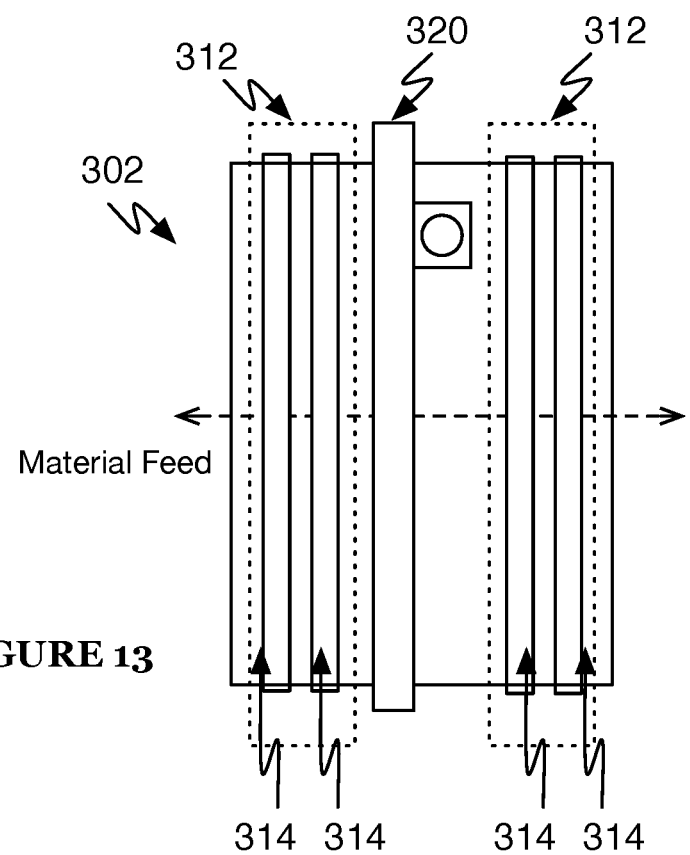
FIG. 13 is a schematic representation of a top view of roller configuration of a roller material feed system.
Figure 14:
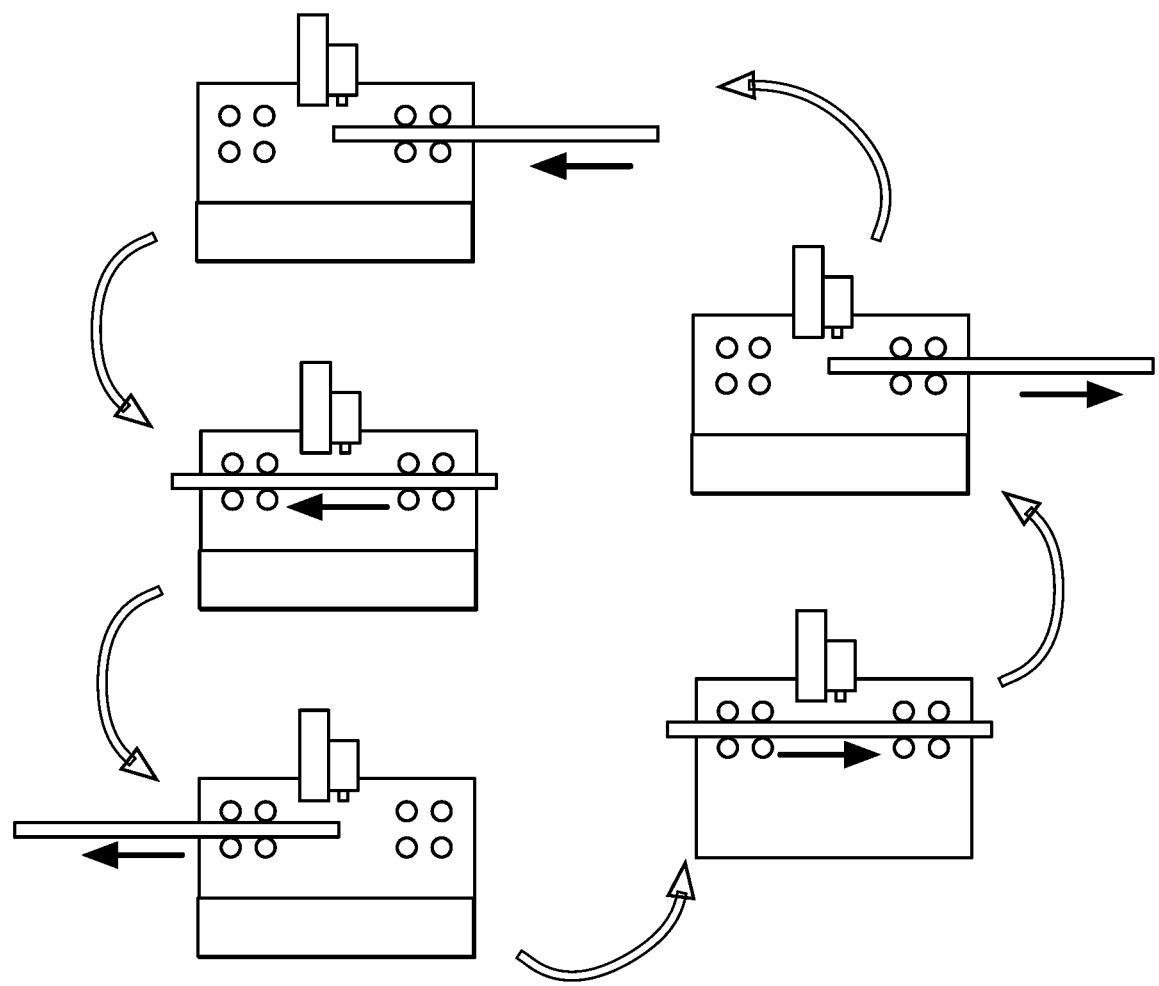
FIG. 14 is a schematic representation of material translation by a continuous material-fed cutting device.

As shown in FIGS. 12 and 13, the roller material-feed system 310 preferably includes two roller feed subsystems 312 positioned on opposing sides of the cutting tool 320, which functions to enable all four edges of a panel fed into the CMF cutting device 302 to be cut by the cutting tool 320. For example, the CMF cutting device 302 can include a first roller feed subsystem 312 comprised of the "front" rollers in front of the cutting tool 320 and a second roller feed subsystem 312 comprised of the "back" rollers in the back of the cutting tool 320. A single roller feed subsystem 312 is preferably sufficient to hold and move the material. As shown in FIG. 14, a material may be initially held by a first roller feed subsystem, passed between the two roller feed subsystems 312, and then held by the second roller feed subsystem. The distance between the roller feed subsystems 312 will generally define a minimum material length for passing between the two roller feed subsystems 312. However, smaller material lengths could be managed by a single roller feed subsystem 312 if cuts are only made on one portion. In general, one of the roller feed subsystems 312 operates as the input and the other as the output. However, the CMF cutting device 302 may operate omnidirectionally such that it can receive material from either end or output on either end.

Each roller feed subsystem 312 preferably includes two pairs of rollers (i.e., roller pairs) 313, where a pair of rollers 313 includes one roller 314 on one side of a defined material path and a second roller 314 on a second side of the defined material path as shown in FIG. 12. In one variation, rollers on one side of a roller pair 314 are used to drive motion and the other side can be used as an opposing and rotatable support when gripping the material. However, any suitable configuration of support rollers and driven rollers may be used.

Figure 15A:
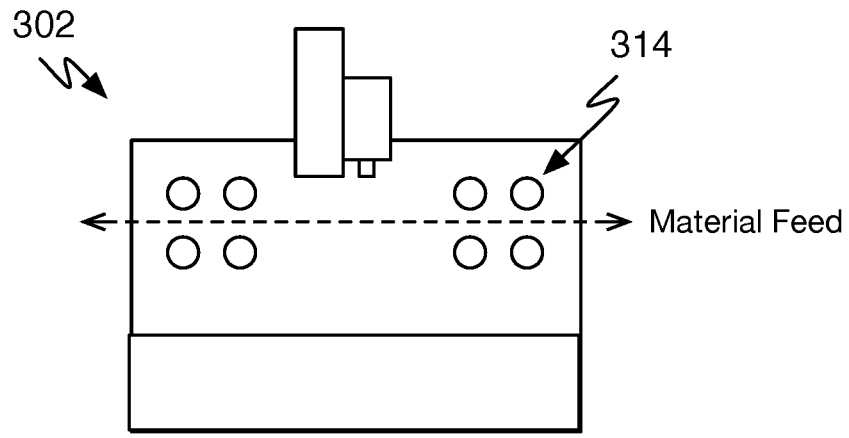
FIGS. 15A-15C are schematic representations of variations of a roller feed system.
Figure 15B:
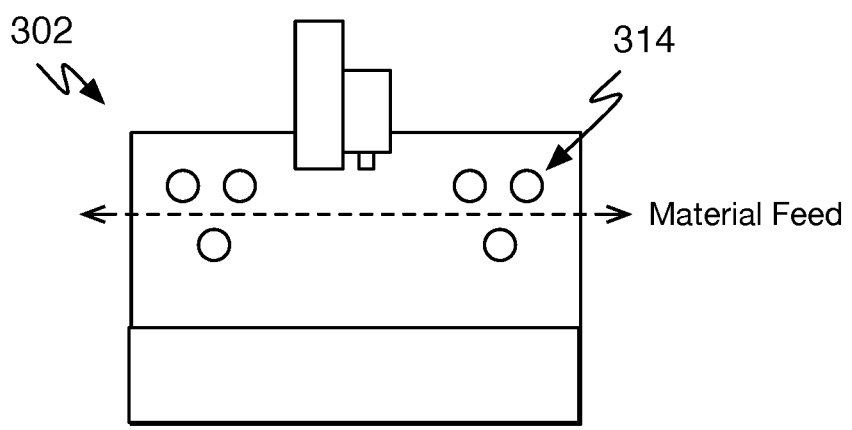
Figure 15C:
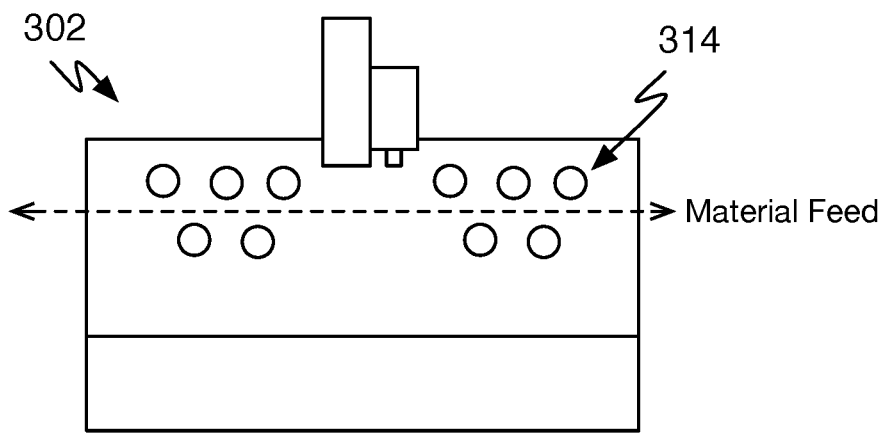

In one preferred variation, the roller material-feed system 310 has eight total rollers 314. In this variation, there are two roller feed subsystems 312, wherein each roller feed subsystem includes two roller pairs 313, resulting in a total of eight rollers 314 as shown in FIG. 15A. In some variations, rollers are not organized into discrete pairs and a staggered arrangement, or any suitable arrangement may be used that satisfy a condition of constraining position of material gripped between two layers of rollers. As shown in FIG. 15B, a roller feed subsystem 312 may use as few as three rollers 314. As shown in FIG. 15C, the roller material-feed system 310 may alternatively use more than eight rollers 314.

A roller 314 is preferably a cylindrical component made of a rigid material. The lengths of the rollers 314 are preferably positioned perpendicular to direction the material will be fed. The rollers 314 preferably rotate about their axis. Support rollers 314 may rotate freely about their axis. Driven rollers 314 may rotate in response to actuation by a drive system 316.

The rollers 314 may have a surface coating such as a rubberized coating that may facilitate tighter gripping and adding friction to prevent material slippage. In some examples, rollers 314 may have teeth or a textured pattern to hold board pieces more firmly during cutting. In one variation, the rollers 314 may be made substantially uniform. In another variation, different types of rollers 314 may be used. For example, drive rollers 314 (ones connected to a drive system 316) may be of one type and support rollers 314 (ones used as an opposing structure to the drive rollers 314) may be of another type.

Figure 10:
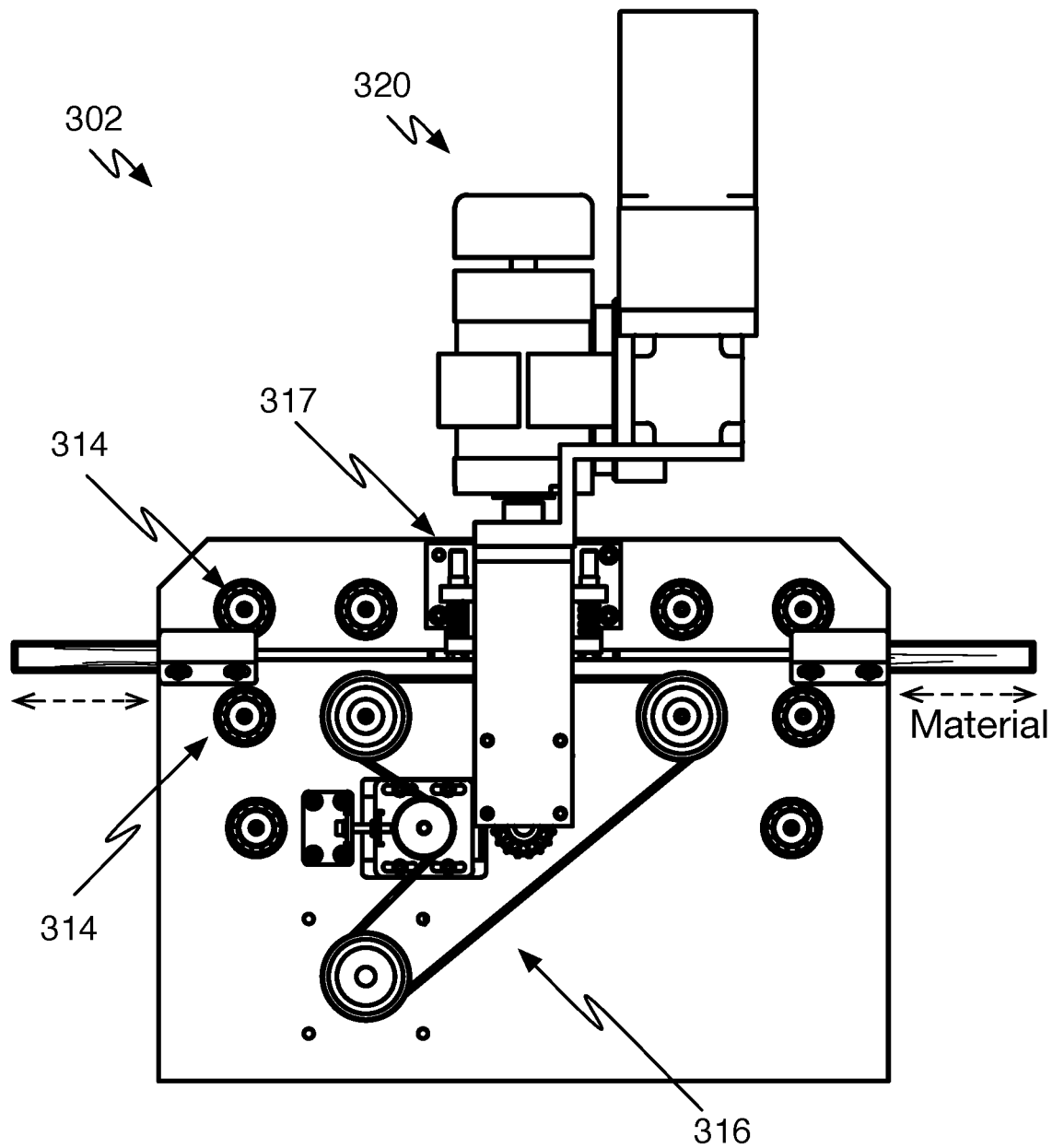
FIGS. 10 and 11 are schematic representations of side views of a continuous material-fed cutting device.
Figure 11:
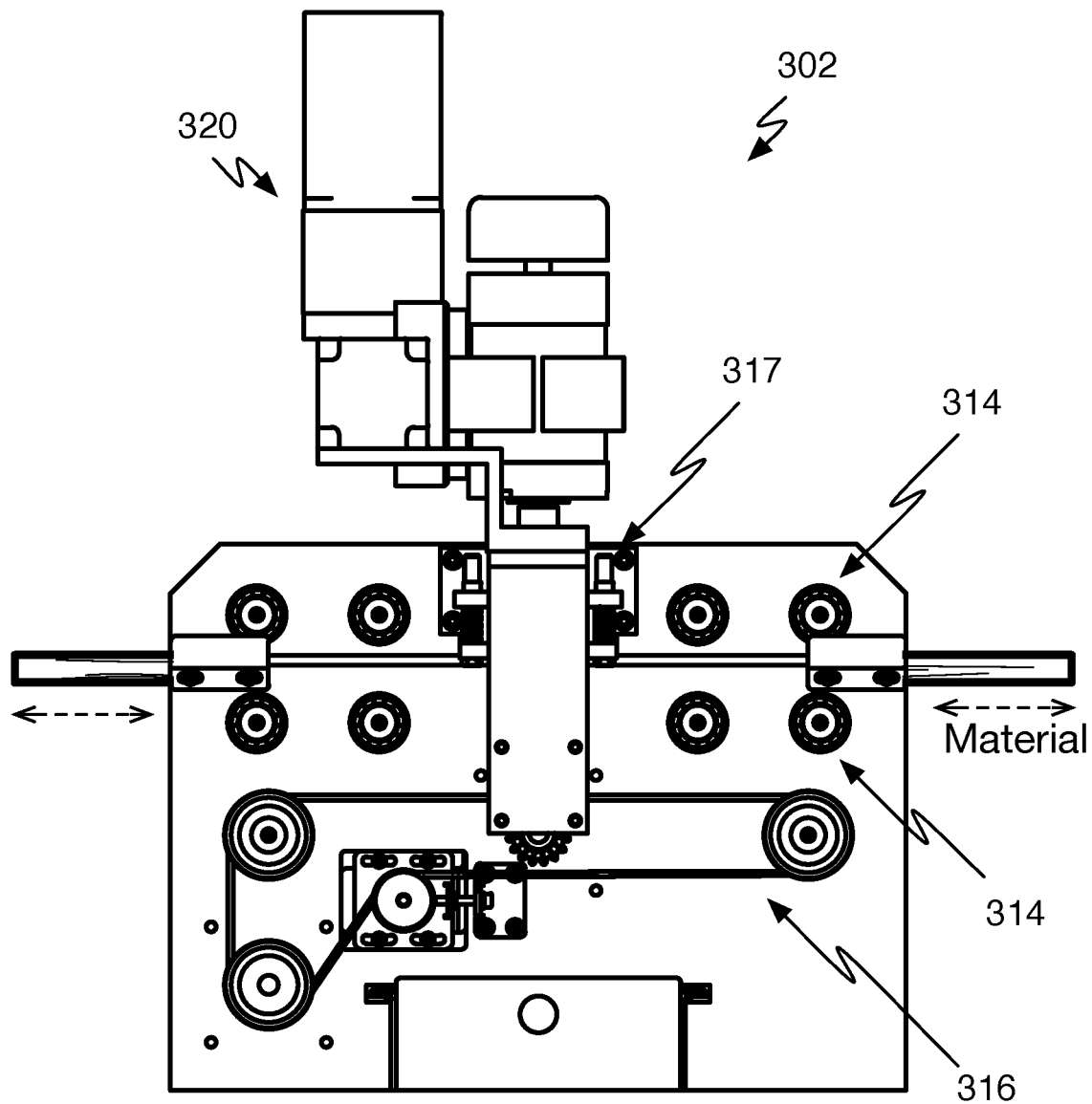

The roller material-feed system 310 preferably includes a drive system 316. The drive system 316 functions to actuate at least one roller to enable the CMF cutting device 302 to "drive" material through the cutting device. In preferred variations, the drive system 316 is connected to one layer of rollers (e.g., either the top rollers or bottom rollers). However, in some implementations, rollers 314 on either side of the material feed axis may be driven rollers 314. Preferably, the drive system 316 drives all rollers in concert. In one implementation, the drive system 316 includes a motor driven belt system that rotates select rollers 314 about their axis as shown in FIGS. 10 and 11. However, the drive system 316 may include individual drive systems for individual rollers 314 and/or for individual roller feed subsystems 312. Preferably, the drive system 316 actuates rollers 314 to enable movement of material forward or backwards within the CMF cutting device 302. In some variations, the drive system 316 may be unidirectional.

In preferred variations, at least one set of rollers 314 are held in place by a roller clamp system 317. The roller clamp system 317 functions to apply force between opposing rollers 314 to hold the material to be cut firmly while still enabling movement. In one variation, the roller clamp system 317 augments the positional setting of a first layer of rollers 314 (e.g., the top set of rollers) and the other layer of rollers 314 are fixed in position (e.g., the bottom set of rollers). The roller clamp system 317 may alternatively manipulate position of both layers of rollers 314. In some preferred variations, the tension of the roller clamp system 317 may be increased or decreased to alter how firmly the rollers hold material. In some implementations, this is achieved by tensioning a spring that controls the force applied by one set of rollers on the material (for example, the top rollers) towards the other set of rollers. As shown in FIGS. 10 and 11, the roller clamp system 317 may include a spring. The tension of the spring may be either modified manually or automatically. In one variation, a spring system may be used, wherein the tension of the spring may be either modified manually or automatically, to alter how firmly the rollers 314 hold the material. In another variation, an actuator such as a motor, hydraulic system, or other suitable actuator may be used to control the grip. In yet another variation, the roller clamp system 317 may be a manually manipulated mechanical clamp set by a user for the material.

The roller material-feed system 310 may additionally include a rip fence 318 that functions to align and guide material through the CMF cutting device 302 as it is being cut. The rip fence 318 may be moved to adjust for the width of the material to be cut. In some variations the position of the rip fence 318 is manually adjusted to the width of the board. In other variations, the CMF cutting device 302 detects the width of the board and automatically moves the rip fence 318 to the appropriate width. In the automatic variation, the rip fence 318 may additionally have a proximity or pressure sensor to enable the rip fence 318 to detect the appropriate width. In some implementations the width set by the rip fence 318 may change as the width of the material changes due to being cut. In some implementations, the width of the fence is automatically set based on system-knowledge of the dimensions of the material being cut.

The cutting tool 320 functions to cut the material as the material is run through the CMF cutting device 302 by the roller material-feed system 310. The cutter tool 320 may be a router, laser, saw, and/or any other tool that can be implemented for cutting the material. In one variation, the CMF cutting device 302 can have a tool changer device to change the cutting head or element used with the cutting tool 320. A CMF cutting device 302 may contain a single cutting tool 320, or may alternatively contain multiple cutting or other types of tools that can be moved independently. The cutting tool 320 is preferably connected to multi-axes actuators that move the cutter along two or three dimensions to enable the cutter to cut the material at the appropriate area. Preferably, the cutting tool 320 is attached to a linear actuator 330 that actuates the cutting tool 320 linearly perpendicular to the direction of the material feed. The cutting tool 320 can additionally be coupled to a vertical actuator that allows the vertical height (i.e., "depth") of the cutting tool 320 to be modified, which can be used in cutting surfaces and different depths in material. In one variation, the cutting tool 320 may have a discrete vertical actuator such that the cutting tool 320 can lift above the material or be set at a height to engage material if present.

In some variations, the CMF cutting device 302 may include additional degrees of freedom—adding one to three angular degrees of freedom. These may be full degrees of freedom but could also be limited where the cutting tool 320 and/or the roller material-feed system 310 can adjust angular orientation within an angular range. In one variation, the cutting tool 320 may be given one or two degrees of freedom about two axes of rotation. Alternatively or additionally, the roller material-feed system 310 can impart one or two degrees of angular freedom to the cutting process. The roller material-feed system 310 may affect an angular rotation of material relative to the cutting tool by having variable height rollers that tilt the material during translation. The rollers could be actuated along rails such that different angles could be imparted. Alternatively, the roller material feed system 310 may be mounted in a system that can be rotated about one or two axes.

In some preferred variations, the CMF cutting device 302 includes a vision system 330. The vision system 330 functions to monitor material that is being processed by the CMF cutting device 302, thereby keeping track of the material and material position throughout the cutting process.

The vision system 330 may employ optical flow monitoring of fed material to track position of the material. In other words, the vision system 330 can track the visual pattern of the material (e.g., the visual surface texture of material) and the material's movement back and forth and side-to-side in the roller material-feed system 310.

The vision system 330 can additionally or alternatively be configured to collect image data of material as the material is fed into the roller material-feed system 310 and characterize material alignment. The CMF cutting device 302 may then modify cutting instructions to account for material alignment. This may allow material to be fed into the machine without precise alignment. For example, if a plank is fed into the CMF cutting device 302 at a ten-degree angle, the vision system 330 may identify the angle of the plank and adjust plank-cutting instructions to appropriately cut the plank.

The vision system 330 could additionally be used to identify the material either by detecting a visual identifier or by using a computer vision (CV) image classifier. This could be used in automatically detecting the raw materials and then selecting an appropriate cut from a cut list for a number of parts. For example, a worker may feed in a number of pre-fabricated snap-lock planks that need modification. The vision system could identify the make and model of the snap-lock planks and appropriately adjust cutting instructions. In some variations, this part identification may be part of the input to the designating system 200 in generating a construction plan.

The vision system 330 may additionally be used to calibrate the CMF cutting device 302 (i.e., determine distance of displacement of material as compared to actuation provided by the driving system). Rollers 314 may wear down over time, become dusty, or other changes to the machine may alter the relationship of material translation and the input of the drive system. The vision system 330 may additionally, or alternatively, enable the system to detect if the material slips while the material is driven through the cutting device and/or being cut. Slippage is evident by translation of the material that is not consistent with output translation of the rollers. This may then be used in adjusting the clamp system 317, adjust cutting speeds, trigger changing of tooling, generating an alert for a dull tool, and/or making other suitable changes.

Figure 16:
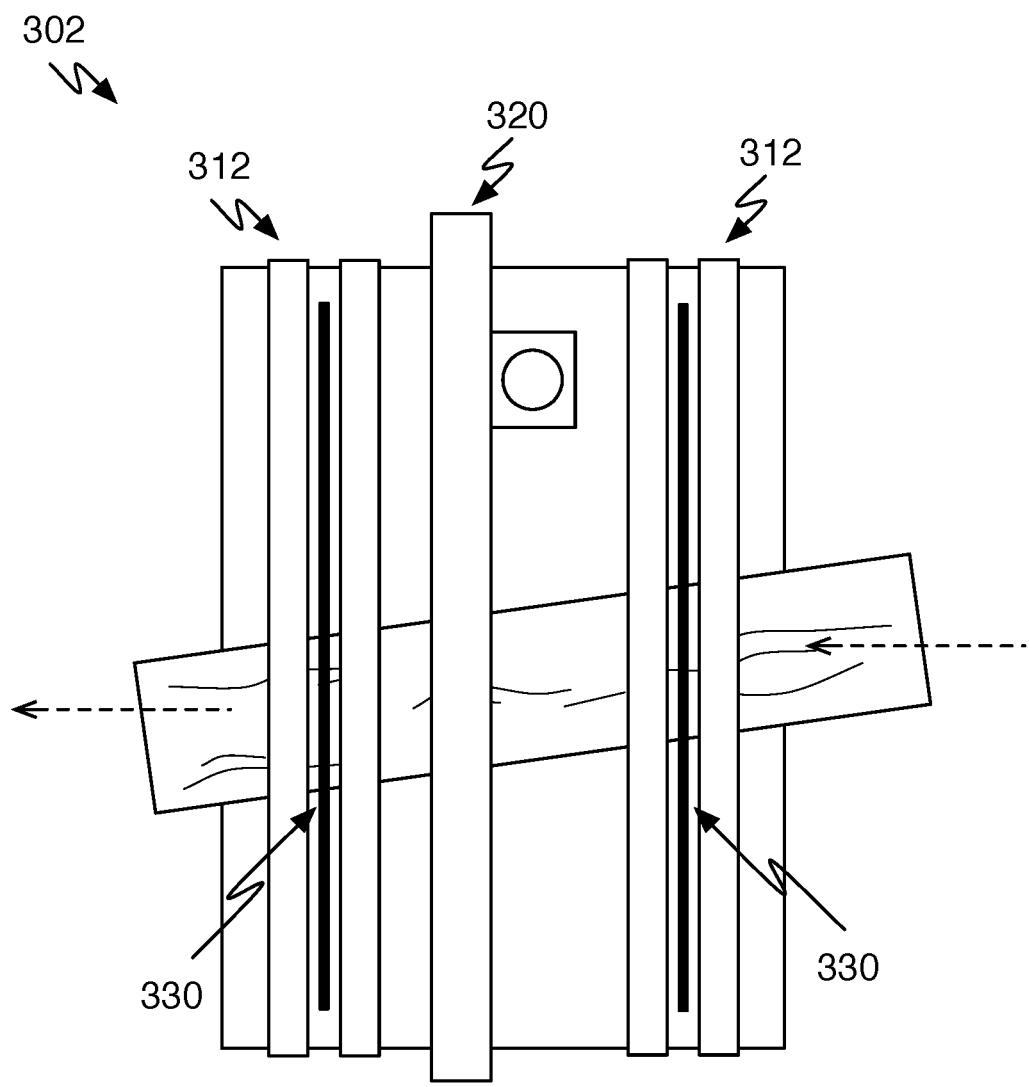
FIG. 16 is a schematic representation of a vision system integrated into the cutting device.

In a first preferred variation, the vision system 330 comprises of at least one sensor array, positioned next to and parallel to a roller 314. The sensor array is preferably aligned along a roller of the input roller feed subsystem 312 but may alternatively be positioned at any suitable position of the roller material-feed system 310. In a second variation that includes two sensor arrays, where one sensor array is positioned adjacent to, or within, a roller feed subsystem 312 on one side of the cutting tool 320 and a second sensor array is positioned adjacent to, or within, a roller feed subsystem 312 on the opposite side of the cutting tool 320 as shown in FIG. 16. Additionally or alternatively, a sensor array could be aligned along the length of the roller material-feed system 310 such that visual tracking of the material can be performed continuously for the material as it moves through the roller material-feed system 310. The sensor arrays can be a linear array of image sensor components. In one variation the sensor array can be a contact image sensor. In another variation, the sensor arrays can be an array of image sensor components with high linear aspect ratio (e.g. 1080×16 pixels).

In a third variation that includes a camera, the camera can be oriented facing the material feed region. Preferably, the camera is positioned interior of the CMF cutting device 302 but may alternatively be an external camera. One camera may be used to view the whole or central material feed region. Alternatively, multiple cameras may be used to view different subregions of the material feed region.

Additionally or alternatively, an encoder (e.g., a rotary encoder) may be added to the shaft of one or more rollers 314 to directly monitor the rotation of the roller and compare to observations in the vision system and or to compare to the instructions given to any driven rollers. In some variations, encoders may be used in place of a vision system. Rotary encoders may be either absolute or relative rotary encoders. In one implementation, two rotary encoders are connected to the two rollers adjacent to the cutter and not connected to the driving system (i.e., the support rollers). In some variations, the discrepancies or correlations between the encoder readings and the movement instructions or the vision system can be used as input for the system's control loop.

Figure 17:
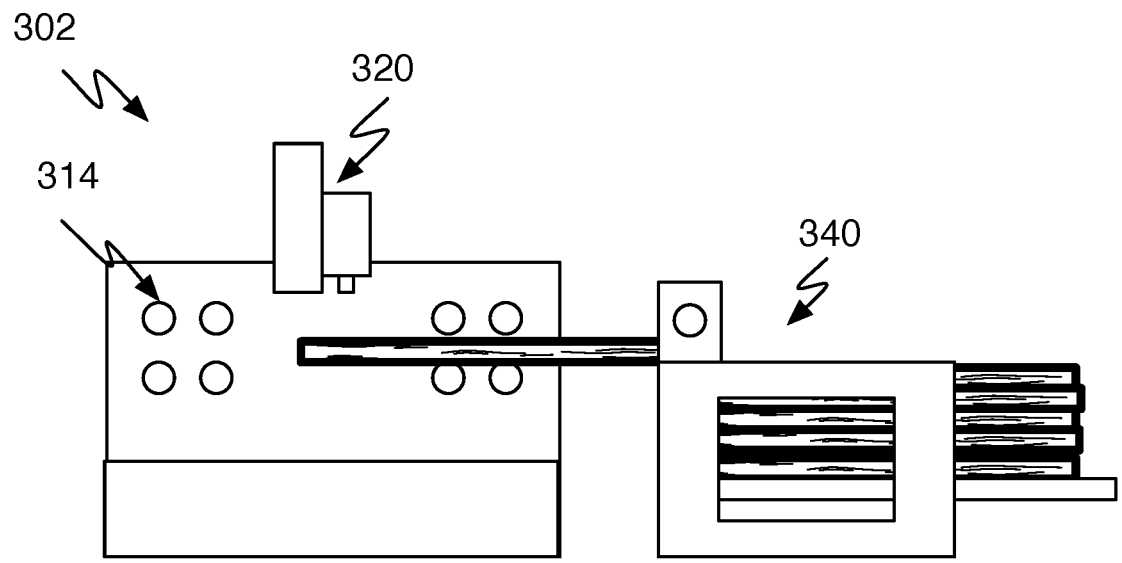
FIG. 17 is a schematic representation of a variation of the system including a material supply system.

The CMF cutting device 302 may additionally include a material supply system 340 as shown in FIG. 17. The material supply system 340 functions to hold material prior to being cut and provide an efficient and convenient manner for the cutting device to be "fed" new material during cutting. The material supply system 340 can include a holding tray or bin to hold a stack of raw materials such as a stack of uniform planks that need customized adjustments. The material supply system 340 preferably includes a delivery mechanism configured to insert a select item into the roller material-feed system 310. Additionally, the material supply system 340 may hold material at the height of the cutting device rollers to provide additional support for the rollers to firmly hold material that extends out beyond the main body of the cutting device. The material supply system 340 comprises a base holding tray maintained at the roller height of the CMF cutting device 302. Additionally, the material supply system 340 may include an actuating feeder.

The holding tray functions to hold material prior to being processed by the CMF cutting device 302. The holding tray may be situated adjacent to the main body of the CMF cutting device 302. The holding tray can be a base body with a flat platform that can hold material. In some variations, the holding tray has a support leg. Material may be stacked onto the holding tray that can then be fed into the cutting device. In a first variation, the holding tray comprises a telescoping bar extending out from the cutting device. The telescoping bar may additionally have a support leg at the extended end. In one alternative variation, the holding tray is situated adjacent and above the main body of the CMF cutting device 302. In this variation, the material is fed board-by-board from the bottom of the stack.

In a second variation, the holding tray comprises two pieces: a telescoping arm extending from the main body of the CMF cutting device 302, and a moving platform holding tray situated at a non-fixed distance and in direct line with telescoping arm. The moving platform holding tray may be situated at any distance, but is preferably situated at a distance such that material can be stably stacked with one material end on the moving platform and one material end on the telescoping arm.

In some variations, the material supply system 340 of the CMF cutting device 302 may additionally include a delivery mechanism. The delivery mechanism functions to automatically push or deposit material from the holding tray into the main body of the CMF cutting device 302. The delivery mechanism may include actuating rollers on the telescoping arm configured to actuate at the appropriate time to drive/roll a single stacked material piece into the main body of the CMF cutting device 302.

Figure 18:
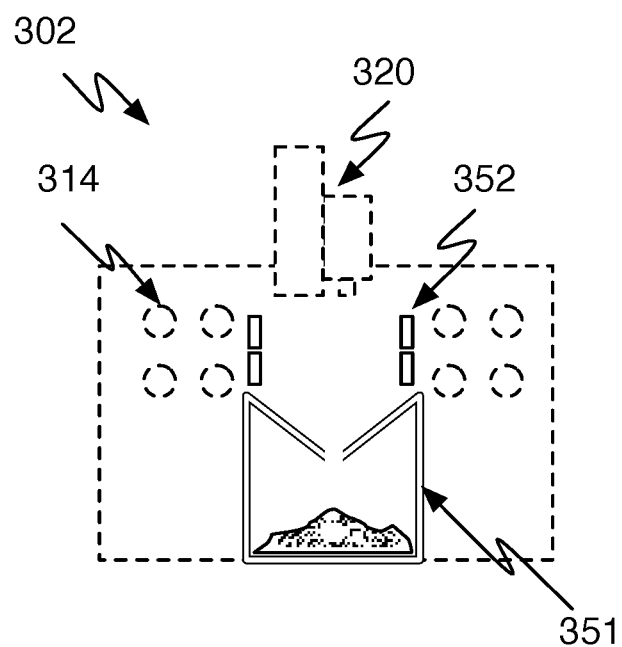
FIG. 18 is a schematic representation of a variation of the system including a waste tray and debris curtains.

The cutting device may further have a waste tray 351 and/or debris curtains 352 as shown in FIG. 18. The waste tray 351 functions to collect debris that is created while the material is cut (e.g., sawdust). The waste tray 351 may be a long tray situated under the cutter 320. The waste tray 351 may be constructed of any material (e.g., plastic, metal). Preferably, the waste tray 351 is sufficiently large such that the tray covers any area wherein the cutter 320 can move. The waste tray 351 may additionally be situated on a sliding platform and have a handle enabling removal of the waste tray 351, for quick and easy emptying. The waste tray may optionally have a port for a vacuum connection to immediately suction waste. The port may be either be a specialized vacuum nozzle, or may enable any vacuum to connect to the port.

Debris curtains 352 function to insulate the noise of the cutter during operation of the CMF cutting device 302 and to contain debris and prevent debris from flying out of the cutting device during operation. The CMF cutting device 302 preferably has two debris curtains 352, one for each entryway: where material is fed into the cutting device, and where material leaves the cutting device. The debris curtains 352 may be constructed of any material that is sufficiently flexible and sufficiently dampens noise (e.g., heavy carpeting, rubber, plastic, brush). The debris curtains 352 are preferably situated internally within the cutting device main body. The debris curtains 352 may be situated outside the region of motion of the curtains and preferably hang near or directly above the boundaries of the waste tray. The CMF cutting device 302 may additionally include a hood or shielding that preferably creates a contained volume with the debris curtains where the cutting occurs. The debris contained in this defined cutting space preferably falls into or is forced into the waste tray 351.

The cutting device may be implemented in one of multiple modes of operation: a planned mode, a semi-planned mode, when some material information is lacking; and a direct use mode, with minimal planning. Each mode of operation may be used independently, or modes of operation may be used in some combination of each other.

In the planned mode, the CMF cutting device 302 is preferably automatically controlled and operated based on communicated cut list instructions. It automatically performs cuts on supplied materials. For example, the user may measure the entirety, or part, of a staircase at one time using the measuring device; pertinent information of the material to be used (material type, board size, board number, etc.) is passed to the designating device 200, the designating device 200 may then plan and allocate each material piece; and each piece may be cut by the CMF cutting device 302 to the correct specifications as set by the designating device. All measurements are made at once, cutting and placement of floorboards are "planned", and then the pieces are cut to the planned specification.

In the semi-planned mode, the user may make single measurements and single cuts with minimal planning. For example, the user may measure the riser or tread of a step of a staircase using the measuring device 100, which then passes the specifications to the cutting device 300 through the designating system 200. The user may then pass a material board through the cutting device 300 to make a flooring piece specific to that one measurement. Each stair piece is then subsequently cut "directly" in the same fashion. Other forms of automation may additionally or alternatively be used such that operating tasks are reduced for a user.

In the direct use mode, the CMF cutting device 302 is controlled or programmed directly by a user. No or minimal prior information may be necessary about the amount and size of each material piece. All measurements, using the measuring device, may be made prior to cutting. Piece allocations are made "on-the-fly" as each piece is cut by the CMF cutting device 302. Additionally, in direct use mode, the cutting device may be used as a general electric saw, with little to no input from the designating system 200. In this way, the CMF cutting device 302 may be used to perform arbitrary cutting and machining tasks.

The CMF cutting device 302 may further have a marking operation mode. The marking operation mode functions to mark a cut material piece (or one that is still being cut) such that the marked piece may be easily identified and matched to the location it is supposed to be installed. In this mode, text and/or image/graphic information may be supplied to the CMF cutting device 302, and the CMF cutting device 302 can automatically apply that mark on a material.

The CMF cutting device 302 may additionally have one or more calibration modes. One preferred calibration mode functions to determine the distance of displacement of the material fed into the cutting device as compared to the rolling actuation provided by the driving system. In particular, the calibration mode determines if this displacement to actuation is constant. Inconsistent displacement to actuation would suggest slippage of material, and in some variations may lead to automatically increasing the tension of the roller clamp system 317 holding the rollers of the CMF cutting device 302 in place or in compensating with additional movement instructions.

Figure 19:
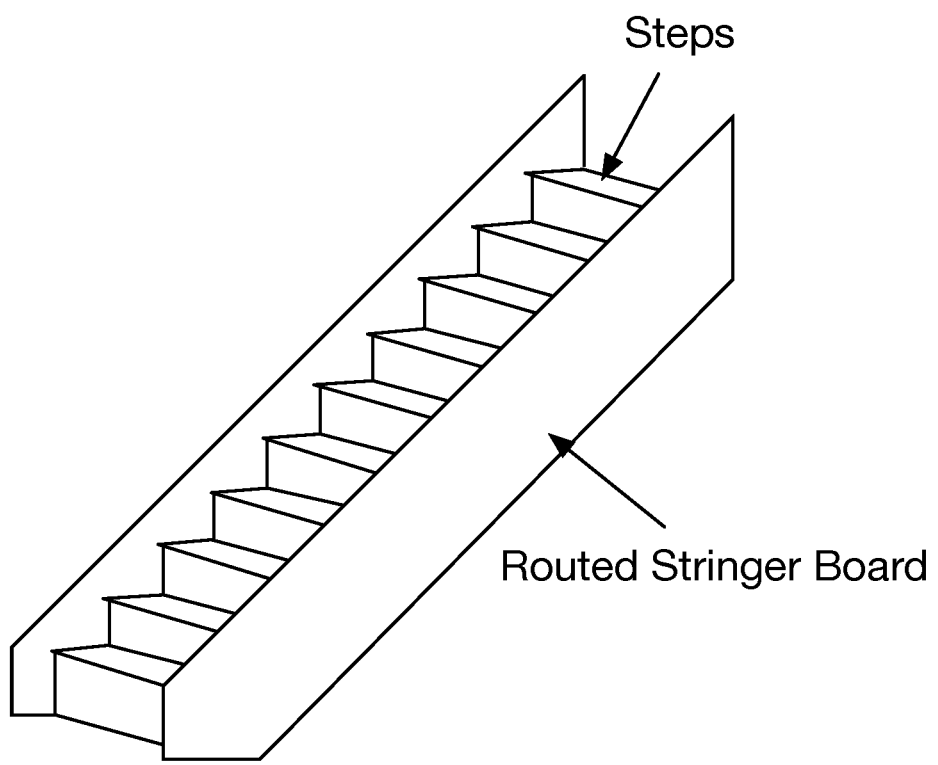
FIG. 19 is one general model of a staircase.

In all cutting modes, the cutting device may be implemented to cut arbitrarily complex shapes as designated by the designating system 200, programmed through a set of cutting instructions, or input through manual controls of the CMF cutting device 302. In one preferred variation, the CMF cutting device 302 may cut stringers, i.e., the side panels of a staircase, as shown in FIG. 19. Additionally, the cutting device may cut pieces for cabinets, counter tops, tables, house siding, window frames, tables, wall framings, beds, or any other object that fits within the maximum cutting dimensions of the cutting device.

The CMF cutting device 302 because of its potentially transportable size may be convenient for using on location at a construction site. In some variations, the CMF cutting device 302 may be operated remote to the construction site. All measurements may be made by the measuring device 100 and stored in the designating system 200. The cut list may then be sent to a remote cutting device 300 that can cut each material piece to the desired specification. The external cutting device 300 may be a CMF cutting device 302 but may alternatively be any type of general cutting device that can make sufficiently accurate and precise cuts of the material. One example for this variation may be if the staircase is to be made of a type of non-typical material, such as granite. The measured information may then be sent to the appropriate vendor to cut the pieces to specification. Alternatively, other flooring types or materials, for example hardwood, laminate, etc. may also be outsourced. The resulting parts can then be delivered to the construction site for use.

In one variation, the system may include an environment sensing system and a material condition modeling system. The material condition modeling system functions to enable cutting of materials to be modified to account for the material changes due to environment factors (e.g., temperature and humidity). Different materials, in particular wood, will change dimensions as they adjust to an environment. The environment sensing system and material condition modeling system can allow the condition at the construction site to be determined and then a material condition modeling system to adjust the cut list dimensions of parts based on material condition and environment conditions at the site of part production (e.g., the site of the cutting device 300). The environment sensing system can be included in the measuring device 100, but may alternatively be a separate device. The environment sensing system could alternatively access environment condition information from a weather service or other similar data service. The environment sensing system preferably collects environment data that includes temperature data and humidity data, but any additional type of environmental information may be collected. The material condition modeling system is preferably a system that can facilitate generating recommended dimensions of a material for producing final dimensions when the material has time to adjust to an environment.

3. Method for Building a Customizable Panel Structure

Figure 20:
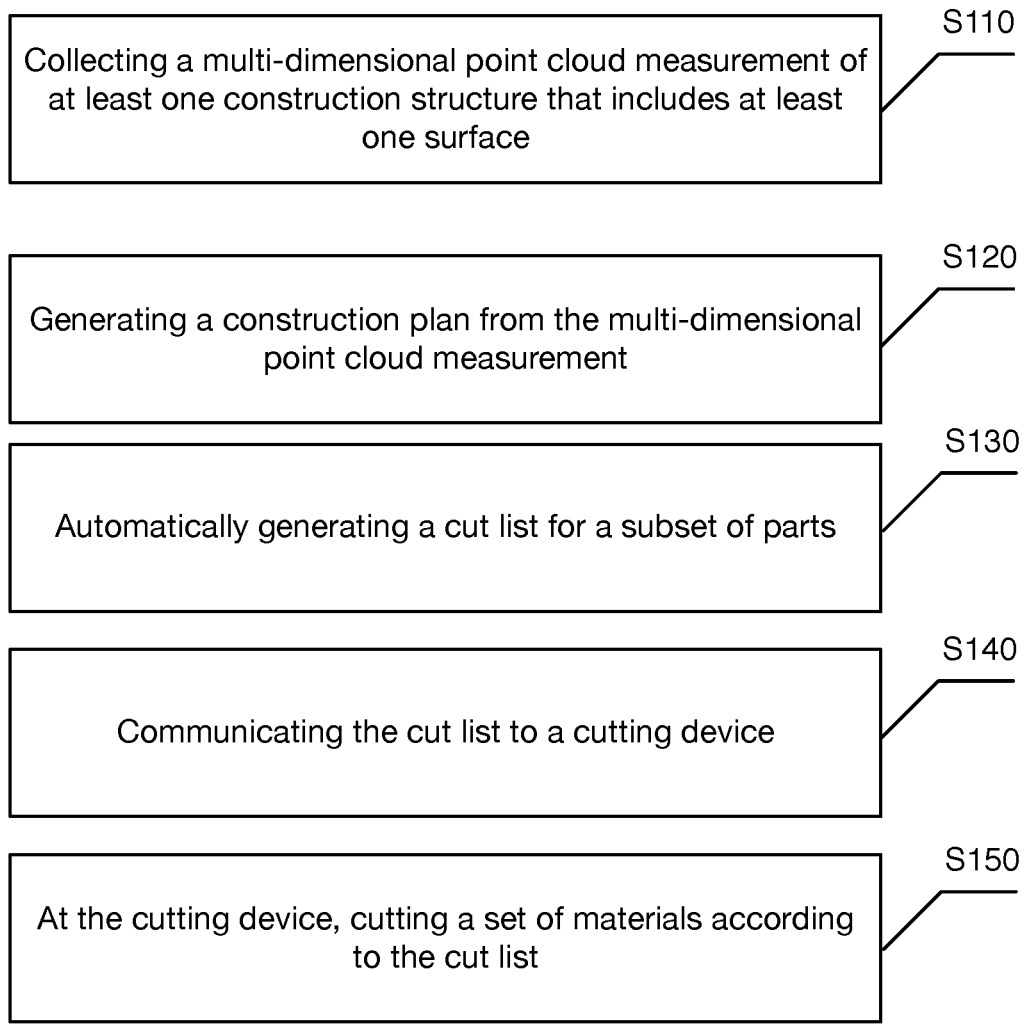
FIG. 20 is a flowchart representation of a method for building a customizable panel structure.

As shown in FIG. 20, a method for building a customizable panel structure of a preferred embodiment can include collecting a multi-dimensional point cloud measurement of at least one construction structure that includes at least one surface S110; generating a construction plan from the multi-dimensional point cloud measurement S120, wherein the construction plan defines an assembly arrangement of a set of parts; from the construction plan, automatically generating a cut list for a subset of parts S130; communicating the cut list to a cutting device S140; and at the cutting device, cutting a set of materials according to the cut list S150. The method functions to create a semi-automated measurement of a structure to act as a base for construction, transform collected measurements into construction plans specific to the precise geometry of that construction structure; and then facilitate the production of finished parts that are directly usable in assembling the construction plans.

The construction structure can be the base stair structure on which the exposed stair flooring is assembled. The construction structure could be the base floor on which floor paneling is installed. The construction structure may alternatively be any suitable structure. Additionally, the customizable paneled structure may be a construction such as countertops, cabinetry, and/or any suitable structure. The method is preferably implemented with a system as described above, but may be implemented with any suitable system of preferred embodiment.

Particularly for complex installation regions but true in general, the method may be performed unto completion for each subregion of the installation region, may be carried out all at once, or may be carried out in some other desired combination. For example, for installation of flooring for a staircase, the entire method may be performed to completion iteratively for each step of the staircase (e.g., measuring a step, determining the cut list for the step, and cutting the flooring for the step). In another example, each method step may be performed in batches for an entire staircase (e.g., all measurements for all steps of the staircase are performed together to completion, the cut list for the entire staircase is determined at one point, and the cut pieces for all the steps are cut at one time). In another example, the method may be performed in some other desired combination of iteration and completion (e.g., half the staircase is measured, cut list determined and cut pieces cut; at one time, then the process is repeated for the second half of the staircase).

As desired, the method may be implemented for the entire installation region or a subregion of the installation region. For example, the method may be applied for flooring for one subregion of a room (e.g., if part of the floor has been damaged and needs to be repaired first).

Block S110, which includes collecting a multi-dimensional point cloud measurement of at least one construction structure, functions to determine the dimensions of an installation region. More generally, collecting a multi-dimensional point cloud measurement S110 measures one or more regions planned to act as a base for constructed paneling. Measuring an installation region is preferably accurate to at least a millimeter, but any suitable level of precision may be used.

The construction structure preferably includes at least one surface. In the case of a flooring space, the construction structure includes one surface. In other applications, the construction surface may include a plurality of surfaces. The surfaces may be adjacent surfaces. In the case of a staircase, there may be a number of adjacent surfaces that meet at an angle. The combination of the surfaces in a staircase can form the construction surface. As shown in FIG. 21 a single step in a staircase may be modeled through arrangement of multiple surfaces. Measuring an installation region preferably includes creating a multidimensional measurement of the installation region.

Collecting the multi-dimensional point cloud preferably includes, at a measurement device, scanning the construction structure and thereby collecting the multi-dimensional point cloud measurement. The multi-dimensional point cloud measurement may be a two-dimensional point cloud defining the perimeter of a surface. Alternatively, the multi-dimensional point cloud measurement may be a three-dimensional point cloud measurement defining a perimeter of at least one surface of the construction structure. As a method for creating and installing a customizable panel structure, the method is preferably limited to a primarily two-dimensional structure, wherein the third dimension may include perturbations as compared to a flat surface. Examples of these perturbations include: unevenly built walls, non-square cornered rooms, uneven step surfaces, uneven house foundation, and warped or water damaged floors. Alternatively, the method may be utilized for fully three dimensional panel structures.

The scanning of the construction structure may additionally include scanning three-dimensional surface elevations at a plurality of points on the construction surface. Thereby, the multi-dimensional point cloud may characterize surface elevations within the perimeter. This may be used in producing shims to counter uneven surfaces. More specifically, a cut list resulting from block S130 may define at least one part with a shim surface. Accordingly, cutting the set of materials would include cutting a part with the shim surface.

In the case of cutting flooring panels, the underside of the panel may be milled down in a desired three-dimensional shape. This may be used to adjust the surface for a slope in the base structure. This may alternatively be used for non-uniform surface variations. For example, for re-flooring an old building, the base structure may be worn down in the middle. The multi-dimensional measurement will preferably capture this feature, and the method will generate custom surfaced panels that complement the worn regions to form a flat flooring surface.

In some situations, a surface may be challenging or impossible to measure with a measuring device using a single scan. Accordingly, the block S120 may involve the scanning of multiple partial point cloud measurements and unifying or stitching the multiple partial point cloud measurements into a single point cloud measurement of the surface. Accordingly, scanning a construction structure to collect the multi-dimensional point cloud measurement can include collecting a plurality of point cloud measurements of subregions of a surface of the construction structure and unifying the plurality of point cloud measurements into a single point cloud measurement of at least one surface.

Dependent on the size and complexity of the construction structure, measuring an installation region S120 may be performed in a single step or in multiple steps. For example, a floor of a single empty room may be measured in a single step using a scanning laser setup in the center of the room that performs a single rotation.

Collecting a multi-dimensional point cloud measurement can be performed through a variety of types of measurement devices such as those described above. In one variation, the measurement device is a coordinate measurement machine (CMM) arm. In another variation, the measurement device is a laser scanning measurement device. In some alternative variations, a mechanical measurement device may be used, which may generate an alternative type of surface measurement. However, a resulting surface measurement defining a surface perimeter could be used with the proceeding steps.

The use of each type of measuring device may vary depending on the use case such as stairs or flooring.

As an example of using a CMM arm for measuring a rectangular staircase, measuring the staircase (in this case the construction structure) may involve, for each step of the staircase: placing the CMM arm relatively central on the step of the staircase, scanning the tread of the step using the CMM arm, and scanning the riser of the step using the CMM arm.

In an example of using a CMM arm for measuring a staircase with complex steps (i.e. steps of the staircase wherein the CMM arm cannot scan the entire step from a single location); measuring the complex staircase may involve, for each complex step of the staircase: 1) placing the CMM arm on the complex step sufficiently close to one end of the complex step such that the CMM arm can scan the tread and/or the riser of that end of the complex step; 2) scanning the tread and/or the riser of the complex step using the CMM arm; 3) moving the CMM arm towards the un-scanned end of the complex step and placing it such that the CMM arm can scan the tread and/or riser of a primarily new region of the complex step while still scanning a small overlapping region that has previously been scanned; 4) repeating steps 2) and 3) until the entire tread and the entire riser of the complex step is completely scanned by the CMM arm; and 5) combining the multiple scans into a single scan of the tread and a single scan of the riser for the complex step. The multiple scans can preferably be unified using a fiducial marker or other suitable form of scan alignment.

One preferred variation of a laser scanning measuring device or an alternative type of scanning measuring device can be a stair-edge oriented (SEO) scanning measuring device such as the one described above. The SEO scanning measuring device facilitates scanning stair treads and risers in a consistent and convenient manner. In the case of scanning stairs with an SEO scanning measuring device, scanning the construction structure can include, for a given position of the measuring device on a stair, scanning a tread surface of the stair and scanning a riser surface of the stair. In an example of using an SEO scanning measuring device for measuring a staircase with rectangular stairs can involve for each step of the staircase: placing the SEO scanning measuring device relatively central on the step of the staircase; setting the SEO scanning measuring device in tread measure configuration mode; measuring the tread of the step; setting the SEO scanning measuring device in a riser measure configuration mode; and measuring the riser of the step.

In an example of using a SEO scanning measuring device for measuring a staircase with complex steps (i.e. a step of the staircase wherein the measuring device cannot scan the entire step from a single location); measuring the staircase, for each complex step of the staircase, can involve: 1) placing the measuring device on the complex step sufficiently close to one end of the complex step such that the measuring device can scan the tread and/or the riser of that end of the complex step; 2) scanning the tread and/or the riser of the complex step using the measuring device; 3) moving the measuring device towards the un-scanned end of the complex step and placing it such that the measuring device can scan the tread and/or riser of a primarily new region of the complex step while still scanning a small overlapping region that has previously been scanned; 4) repeating steps 2 and 3 of this example until the entire tread and the entire riser of the complex step is completely scanned by the measuring device; 5) combining the multiple scans into a single scan of the tread and a single scan of the riser for the complex step.

Block S120, which includes generating a construction plan from the multi-dimensional point cloud measurement, functions to transform the point cloud measurement into an understanding of the construction surface challenges and facilitate a plan for paneling the surface(s). The construction plan sets how each piece will be arranged and placed on, or around, the construction structure. The resulting part dimensions can then be used in defining a cut list for parts in block S130. A construction plan is preferably job specific and unique to the present construction structure. The construction plan may additionally vary depending on design parameters, specified materials for use, or parameters of the materials. In general, a designation system will be supplied with panel part specifications defining the standard uniform part types to be used (e.g., the tongue and groove planks used for treads, wood panel dimensions for riser and nosing part numbers). The paneling part information in combination with the point cloud measurement can be used to determine how each paneling material piece should be arranged and placed.

As one substep, generating a construction plan may include transforming a point cloud measurement to a surface model. The surface model is preferably a cleaned representation of the point cloud measurement that represents the physical form of the construction structure. This may additionally involve the assembly of multiple point cloud measurements of multiple surfaces into one model. In some cases, user input may be used to resolve ambiguities in the point cloud measurement data.

As described, the construction plan preferably characterizes an assembly arrangement of a set of parts. The assembly arrangement preferably characterizes placement of parts to cover the construction structure or at least a subset of surfaces. In many cases, such as stairs, the construction plan additionally specifies parts used in joining adjacent surfaces such as nosings of stairs or edging of a floor. The assembly arrangement will preferably define the spacing, alignment, and arrangement of the various parts involved in building the desired project. In general, the project is flooring (for a floor or for stairs). The project may alternatively be other projects such as countertops, shelving, windows, and/or other construction coverings or surfaces. The assembly arrangement characterizes placement of parts to cover the construction structure.

Generating a construction plan furthermore can perform a number of optimizations or automatic enhancements to generate an assembly arrangement that avoids common issues. In other words, the assembly arrangement can define an arrangement of a set of paneling parts on at least one surface such that the arrangement satisfies a design/aesthetic condition (e.g., a balanced panel sizing condition). For example, the assembly arrangement can avoid alignment of staggered panels where a subset of the panels is cut significantly shorter or thinner than others. In general, the balanced panel sizing conditions act to center panel pieces used to cover regions of a structure. Calculations to satisfy these conditions can become nontrivial for complex staircases such as when steps are not simple rectangular treads but may be curved or angled.

In some variations, the construction plan may be generated in part based on external input. A user will generally facilitate entering information used in forming the construction plans. Generating a construction plan may therefore include collecting design input. The design input may be select parameters of the used materials. More preferably, the design input can include specification of parts. This may be used to access material data, or the material data may be include when specifying the part. Material data preferably includes the physical dimensions and type (e.g., laminate board 1"×4"×10"). Additionally, paneling material data may include any other desired information (e.g., weight, price). The design input may additionally include specification of cosmetic options such as panel layout patterns. Examples of general design customization options may include: choosing between patterns of different staggered paneling arrangements, choosing the cut piece shape, and choosing the direction of the paneling (e.g. flooring boards that are parallel or perpendicular to the direction of the staircase). In some cases, a construction plan may be generated, and a resulting assembly arrangement could be presented on a user interface. A user could then supply updated design input, which can be used in regenerating the construction plan.

For a flooring job, wherein a desired paneling structure is flooring for a region of a base flooring (e.g., hardwood flooring for a living room), a user will generally input the standard floor panel parts to be used. The construction structure for a flooring job will generally include a base flooring surface, and generating a construction plan will define dimensions and assembly arrangement of flooring planks such that the cut list specifies cutting instructions for non-standard flooring planks. Using dimensions of the specified floor panel part and the point cloud measurement, generating a construction plan will preferably determine a staggered arrangement of the floor panels to fill the floor space. The arrangement will also determine boundary floor panel pieces and their modified sizes as they meet the edge of the space.

When used with stairs, the construction structure may call for a construction plan specifying at least one tread surface, and one or more of: riser and nosing pieces. In complex stairs, there may be multiple nosings (for example in FIG. 23), and there may be multiple riser surfaces (FIG. 21) for a single tread surface. Staircases can have many variations. The construction plan of a stair may specify, for example, nosings on one side (e.g., both sides of stair closed), two sides (e.g., one side of stair open), three sides (e.g., both sides open), or even four or more sides (e.g., "boxed stairs"). Accordingly, generating a construction plan can define and specify dimensions and assembly arrangement of stair tread parts, riser parts, and nosing parts. The dimensions that deviate from standard parts or not available will then result in part modifications specified in the part list. Accordingly, the cut list will specify cutting instructions and/or dimensions for non-standard parts in the set of stair tread parts, riser parts, and nosing parts.

In some variations, the construction plan can specify designs for multiple piece treads, risers, nosing, and/or other components. In particular the construction plan can specify nosing designs comprised of multiple individual parts that can be assembled into nosing of a single step. More specifically, generating a construction plan can include specifying for one step a multiple piece nosing, board(s) of tread, and/or board(s) of a riser.

Generating the construction plan for stairs can involve a complex set of calculations that account for how the various parts engage and the desired assembly approach. Material thickness, how parts will be joined, and other factors are considered.

Figure 22:
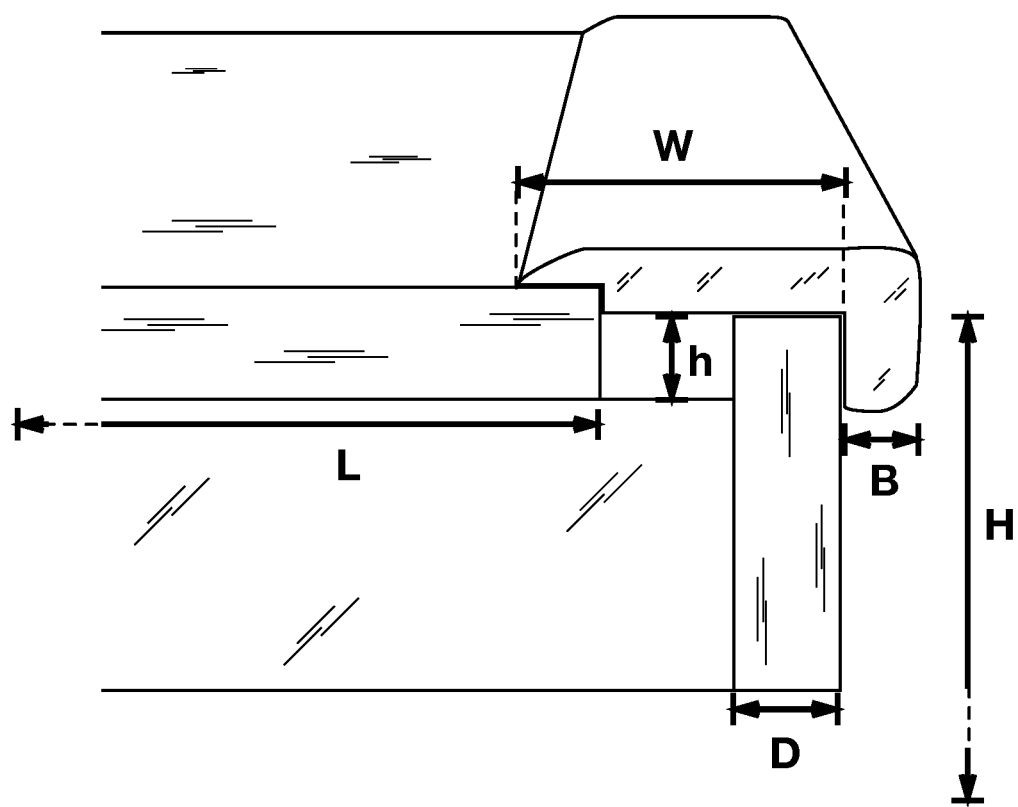
FIG. 22 is a diagram representation of construction plan modeling considerations.

As shown in FIG. 22, for an exemplary staircase step that includes a tread, a riser, and a nose piece, determining a construction plan preferably considers the thickness of the riser D, and/or the effective height of the riser H, and/or the thickness of the lip of a nose piece B, length L of the depth of the tread to engage with the nose piece, the overlap width of the nose piece W, and a resulting spacing h between construction surface and the bottom of the nose piece.

In some variations, nosings may be built out of stock flooring material. In some implementations, the construction plans will include generating part lists and or cutlists to create nosings to match the measured profile of the stair, tread, or riser.

Figure 23:
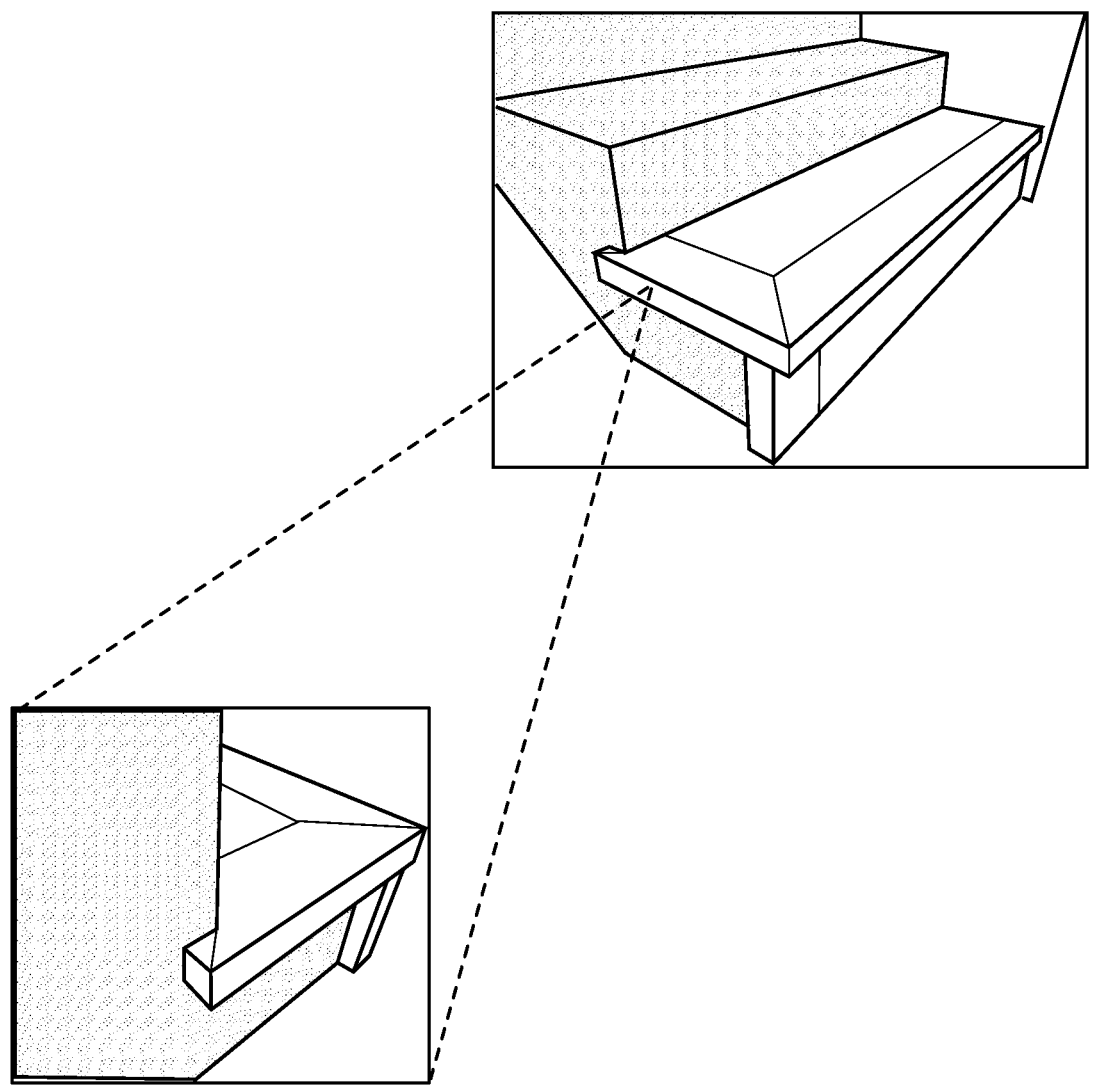
FIG. 23 is a schematic representation of a construction plan for floor material joined using mitre cuts.

Other stair designs may prompt other design constraints and calculations. For some stairing jobs, multiple sides of the stair will require nosing. This nosing is often built from the flooring material and utilizes a tongue and groove system. The construction plan must account for the angles at which different components meet as well as the required dimensions of the tongue and groove system. In some designs, the tread flooring can be joined using mitre cuts. As shown in FIG. 23, multiple nosing pieces with custom angle cuts and nosing overhangs may be considered in generating a construction plan.

From the step measurements, and available material data, a construction plan can be generated. Additionally, customizing the implementation may change any and/or all these data, requiring and generating an alternative construction plan (if physically possible). In one variation, if a customization request is not possible, the method will generate an alert (e.g., warning or error) informing the user that the request has issues and providing information about the issue and possible suggestions to solve the issue. In another variation, if the customization allows for multiple possible assembly arrangement options, the method may inform the user of the multiple possibilities enabling the user to pick between them.

For a cabinetry job, wherein the paneling structure is a three-dimensional cabinet structure that sits, hangs, and/or is adjacent to the installation region, generating a construction plan preferably determines how parts of the cabinet interconnect. In one example interlocking cut pieces include tongue and groove joints. In a second example interlocking cut pieces include locking miter joints. Construction plans could be generated for other similar types of construction jobs.

Block S130, which includes automatically generating a cut list for a subset of parts, functions to translate the construction plan to a set of part modifications. In one variation, the cut list may specify details on generating a part from raw material (e.g., a plank of wood). In another variation, the cut list may specify details on modifications to be made on a standard part such as a flooring plank or nosing section of specified dimensions and with tongue and groove edges. The cut list preferably translates part dimensions specified in the construction plan to cutting device instructions or processes. In some variations, this may include generation of g-code or other machine code used in instructing the operation of the cutting device.

Block S140, which includes communicating the cut list to a cutting device, functions to transfer instructions of the cut list to a cutting device. In some variations, the cut list will be generated on a measuring device or alternatively an application operable on a mobile computing device, a server, or other suitable computing environment. The cut list and relevant operating instructions can be sent to the cutting device. Communication may be performed over a wired or wireless network. Communication may alternatively be through data transfer using a physical data storage medium like a memory card. In some variations, the cut list and possibly the construction plan may be generated by a computing system integrated with the cutting device, in which case communicating the cut list may be simply relaying operation instructions of the cut list to initiate operation of the cutting device.

Block S150, which includes cutting a set of materials according to the cut list, functions to cut input materials (raw materials or partially fabricated parts) into the proper size and shape to match the cut list specifications. The material is preferably cut to precisely match (within a millimeter accuracy) the part specification of the construction plan. In general, the cutting device may automatically cut and generate parts from the cut list based on the current input material. A user may specify the input material. Alternatively, the cutting device may automatically recognize the material (e.g., detecting a part identifier, image recognition, or through other techniques.).

The process of cutting a set of parts from the set of materials may be performed through a variety of processes. In a more manual mode, an operator may input a part identifier into the cutting device along with the appropriate input material. The cutting device accesses cut list instructions for that part identifier and executes the cutting instructions. In a semi-automated mode, the cutting device may track and manage production of parts. For example, an operator may only specify the input material type, and the cutting device can manage generating a part not previously generated for this project that uses that material. In some cases, a material feed allows a plurality of one type of material to be sequentially input into the cutting device. The cutting device can track the generated parts and automatically generate all the parts originating from that type of material.

Cutting the set of material can include cutting one to four sides of paneling material, as prescribed through the cut list. Basic cuts may include cutting parts to a designated length, to a designated width, and cutting the part at an angle. In some cases, a non-straight path may be cut. In variations where the cut piece is allocated to be installed on a non-flat surface, cutting the set of materials may include cutting/shaving along a surface or region of the paneling material to make an accurate and precise fit (e.g., in variations that shimming is required for steps of a staircase). Depending on the capability of the cutting device, a variety of types of machining and material modifications may be made.

Cutting a set of materials can include making linear cuts, angled cuts, non-linear cuts, and the like. As discussed above, some parts may be cut with the shim surface. For a part with a shim surface, cutting material for the part can include translating position of material along one horizontal axis and translating a cutting tool perpendicularly; and varying elevation of the cutting tool in coordination with horizontal translation thereby promoting surface cuts on the material.

A variety of types of cutting devices may be used as the cutting device. Preferably, the cutting device has at least two degrees of freedom. In a preferred variation, the cutting device has three linear degrees of freedom when cutting the material.

More preferably, cutting material is cut by a continuous material-fed (CMF) cutting device such as the one described above. Cutting material with a CMF cutting device comprises retrieving material from an input to a material feed system; translating material position along a first defined axis within the material feed system and translating a cutting tool along a second defined axis that is perpendicular to the first axis; and actuating a cutting tool along a third dimension normal to the first defined axis and second defined axis. As discussed above, automatic feeding of material may be used to efficiently produce parts from the part list. Accordingly, cutting the set of material may include feeding uncut materials into a bed of the cutting device and ejecting or outputting cut materials through an output, upon finishing cuts of the material. More details on the operation of such a CMF are described herein.

In some implementations, a cutting device may have limited capabilities to modify just lengths, widths, end angles, and/or other standard modifications.

Some materials and parts may be susceptible to changes in shape and form as they acclimate to the environment at the installation site. As a standard practice, materials are often left several days to acclimate to an environment before use. Since the system and method described herein preferably offer convenience and speed of use, the ability to cut precise parts without requiring such material acclimation is desirable. Additionally, some implementations of the method may involve cutting the materials in a site remote from the installation site and delivering the materials to the site. Accordingly, in some variations, the method can additionally include processes whereby the environment at the installation site and the conditions of the material may be used to cut the materials so that resulting parts will be dimensioned appropriately when acclimated to the environment. This can be the case in the event that materials are cut without requiring days of time to acclimate. This may also be the case where the parts are cut at a remote site and delivered to the installation site.

Figure 24:
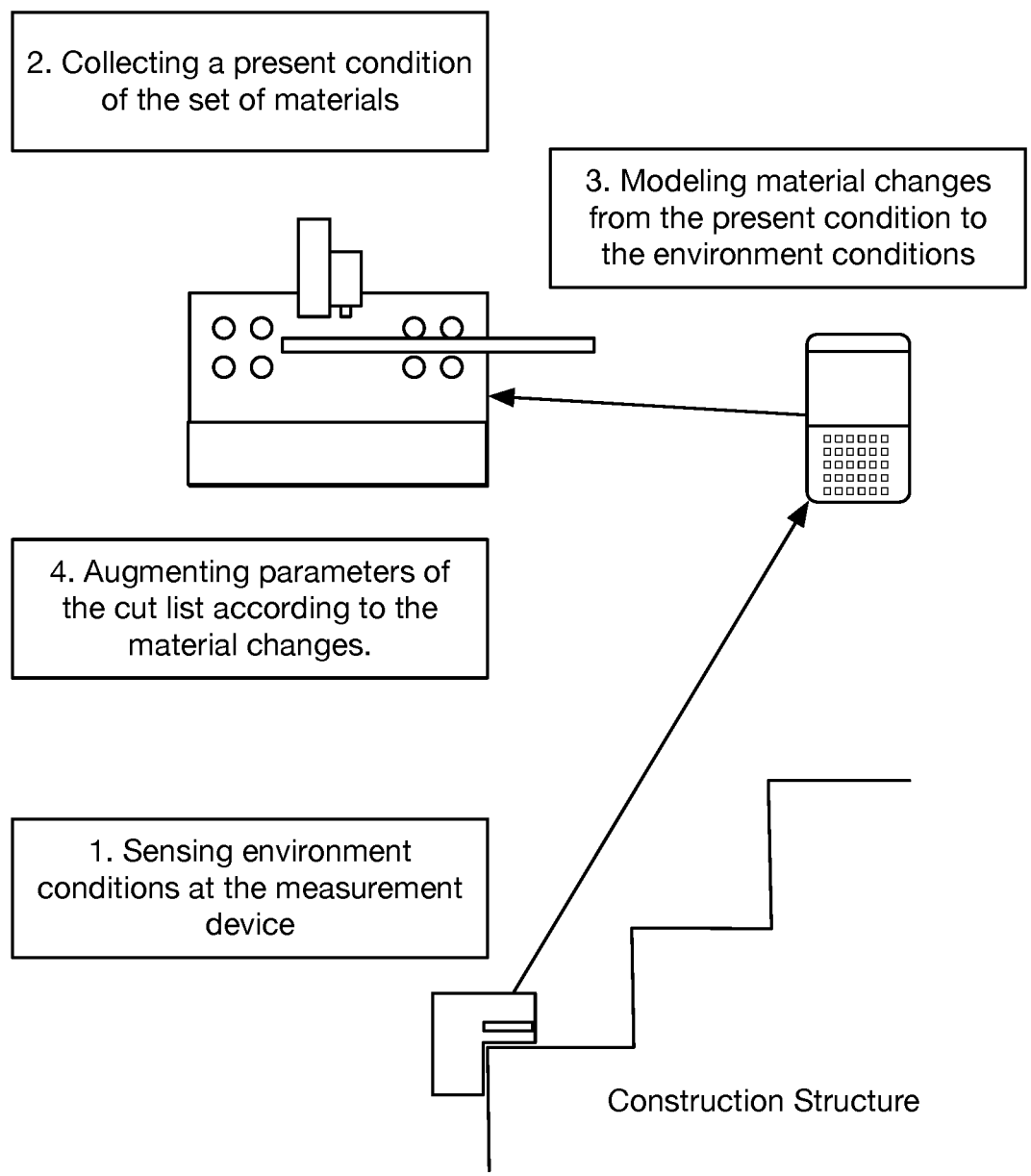
FIG. 24 is a schematic representation of modifying cutting in response to environmental conditions.

More specifically and as shown in FIG. 24, the method may include sensing environment conditions at the measurement device; collecting a present condition of the set of materials; modeling material changes from the present condition to the environment conditions; and augmenting parameters of the cut list according to the material changes. The resulting parts are preferably cut such that when delivered and eventually acclimated to the environment conditions of the installation site, the parts warp or change to the desired part size. Modeling material changes may involve collecting a data set of materials and/or individual parts and their changes for various environmental conditions. The environmental conditions preferably include temperature and/or humidity, but may include other attributes such as altitude and air quality. Environment conditions may also describe more general environmental conditions based on location such as climate type, average temperature ranges over a year, average humidity levels over a year, and the like.

In another variation, the method can involve labeling of parts to facilitate ease of following assembly instructions. In this variation, the method may include assigning an identifier for each part, and when cutting the set of materials, marking a material with an identifier assigned to a corresponding part. The identifier may be assigned at any suitable stage, but is preferably performed during block S120 or S130. The marking may be performed through the cutting tool. For example, an identifier could be milled into the bottom surface of the input material. Alternatively, a label (like a sticker) may be generated and applied to the material. This could be an automated feature of the cutting device or a secondary operation during processing of the material. In some variations, this may include linking a previously existing marking on the paneling material with the desired cut piece(s) that it will be cut into. This linking preferably occurs on some computational/electronic platform, but may alternatively occur in a physical form (e.g., stamp, or imprint on the allocated paneling material). If the paneling material has no previously existing marking, demarcating the allocation can include adding an initial marking.

Marking a material with an identifier, functions to add an identifier to the cut piece to assist a person, machine, and/or device, to correctly install the cut piece in the appropriate location. The marking on the cut piece is preferably on a location such that it is not visible once installed (e.g., on the bottom side of flooring). Marking each cut piece may comprise writing, burning, etching, adding a sticker, or any other alternative method and/or combination of marking methods. Marking of each material can be performed by the cutting device and/or alternatively by any suitable material handling device.

The marking may be useful to a user. But the marking may be further used in user operation of an assembly user interface. In one variation, the method may additionally include, at an assembly user interface, receiving a part identifier input and rendering a graphic indicating position in the assembly arrangement for a part assigned the part identifier input. The assembly user interface is preferably a graphical representation of instructions for completing the construction plan. The graphical representation may be presented digitally in a computing device. The graphical representation may more generally be presented in an assembly report which could include a printout or other physical medium as well as digital/interactive representations. The assembly user interface can be used to assemble the parts. Using the identifier, a user could input or scan the identifier marked on a part, and the part may be highlighted in a graphical representation of where that part belongs.

4. Method of Operating a Continuous Material-Fed Cutting Device

As shown in FIG. 25, a method for processing material with a continuous material-fed (CMF) cutting device can include retrieving material processing specifications S210; retrieving material from an input S220, which includes feeding the material in between two sets of rollers S222; actuating material between the two sets of rollers S230, which includes gripping the material between pairs of rollers S232, wherein each pair comprises at least one roller from each set of the two sets of rollers, and driving at least one roller that is gripping the material S234; and actuating a cutting tool S240, wherein actuating occurs along at least one axis orthogonal to the direction of motion of the actuating material, and includes controlling activation of the cutting tool to process (e.g., cut) the material S242. In general, the CMF cutting device translates the position of a material through a material feed system and along a first material feed axis, while a cutting tool is translated along a cutting axis that is perpendicular to the material feed axis. For example, the CMF cutting device may translate an input material horizontally back and forth for cutting. The cutting tool elevation can be varied while translating along the cutting axis, which could be used to allow three-dimensional surface cuts of material, perform etching and marking, make cuts of varying depths, and the like.

The method functions to automatically shape material, of limited height and width but indefinite length (e.g., board or board-like material). That is, the method enables the processing of material limited in two dimensions with no real limitation on the third dimension. Hence, the cutting device is referred to as a continuous material-fed cutting device, the material is typically not continuous and is not limited to fully supporting continuous material. The method preferably functions with a system as described previously, but may function independently or with any other applicable system. The method or operation may additionally be used in combination with the method for building a customizable panel structure above.

Block S210, which includes retrieving material processing specifications, functions to obtain specific information about the loaded material (e.g., material type and material dimensions) and instructions for processing the material (e.g., how to cut or machine). In some preferred variations, retrieving material processing specifications S210 includes details of how the material should be processed (e.g., how the material should be cut and labeled). Retrieving material processing specifications S214 may comprise of receiving direct user input. This may include the use of manual operating controls that can be executed during processing of the material. In this way, the cutting device may be used as a general-purpose automated machining device. In some preferred examples, retrieving material processing specifications S210 includes retrieving the specifications from a designating system, wherein this designating system contains some and/or all details required about both the material and how the material should be processed. In these examples, the material preferably has some type of marking (e.g., sticker, etching, UPC, etc.) that links the material to specification of the material. Retrieving material specifications S210 may then include scanning the marking and accessing the material specifications. Alternatively, image analysis techniques may be employed to "recognize" the material piece and match it to the information in the designating system. Scanning of the material is preferably performed by a sensor or camera on the cutting device. Alternatively, a user may read the material marking and type it in to obtain material specifications. In one alternative example, the marking on the material includes all the material data and material specifications and this information may be read and entered by either a user, or scanned in by the cutting device.

Block S220, which includes retrieving material from an input S220, functions to set up a specific piece of material for processing. Retrieving material from an input S220 preferably includes feeding the material in between two sets of rollers S222. Retrieving material from an input may be fully automated, partially automated, or manually driven.

Block S222, which includes feeding the material in between two sets of rollers, functions to load the material into a cutting device. Feeding the material in between two sets of rollers S222 "locks" the material between the two sets of rollers, enabling actuation of the material by the rollers. That is, the material is held fast between at least two rollers, where at least one roller is from a set of rollers below the material, and at least one roller is from a set of rollers above the material.

Block S222 may be a manual or automated process. In one variation where the feeding the material is a manually driven process, feeding the material in between two sets of rollers is accomplished by a user, wherein a user places the material in between the two sets of rollers. In a semi-automated variation, a user stacks all the desired material onto a feeding tray, wherein the feeding tray may have either a conveyor type actuation, roller actuation, or some other type of feeding actuation. For this variation, feeding the material between a set of rollers S222 further comprises feeding a single material piece through the feeding tray actuation. In a fully automated variation, feeding the material in between two sets of rollers may include a robot (e.g., or robot arm) or other type of automated system feeding the material in between the two sets of rollers.

Block S230, which includes actuating material between the two sets of rollers, functions to move the loaded material through the cutting device to process the material. The two sets of rollers are preferably roller feed subsystems positioned on opposite sides of the cutting tool. Actuating material between the two sets of rollers S230 includes gripping the material between at least a pair of rollers S232, and driving at least one roller that is gripping the material S234. The material is preferably gripped and held by at least one of the roller feed subsystems during actuation. As described in the system, various configurations of rollers may be used to securely grip the material. Generally speaking, actuating material between the two sets of rollers is to process the material, but material actuation may be for other reasons (e.g., calibrating the device). Preferably, actuating material between the two sets of rollers S230 is an automated process. Actuating the material may be unidirectional. That is, the material enters the cutting device from one side and is unidirectionally actuated out of the cutting device on the other end. Preferably, actuating the material is bi-directional. In many variations, actuating the material between the two sets of rollers S230 may actuate the material back and forth over the same region of the material multiple times enabling complex processing of the material.

Block S222, which includes gripping the material between pairs of rollers, is a component of actuating material between the two sets of rollers S220. Gripping the material between pairs of rollers functions to optimize actuation of the material (e.g., prevent slipping of the material) and to help maintain high precision processing by maintaining precise knowledge of the location of the material within the cutting device. In preferred variations, the cutting device has two sets of rollers, wherein one set of rollers is situated directly above and adjacent to the other set of rollers below it; such that each roller from the top layer of rollers is paired and adjacent to a roller from the bottom layer of rollers. Gripping the material between pairs of rollers S232 comprises having at least one roller from the top set and at least one roller from the bottom set to exert the appropriate pressure on the material piece between them.

Appropriate pressure may be sufficient pressure to hold the material fixed when the rollers are still, while still not too much pressure to inhibit rotational movement of the rollers and translational movement of the material. In preferred variations, sufficient pressure includes having sufficient pressure to prevent slippage, which is sufficient pressure where the rotation of the rollers is fully transferred to translational actuation of the material. If the pressure between the two rollers is insufficient, the material may slip such that the rotation of the rollers does not always lead to direction actuation of the material; and if the pressure between the two rollers is too much, movement of components may be impeded, or the material could be damaged.

The no-slippage condition may be monitored by determining if the translational velocity of the material is proportional to the angular velocity of the gripping roller. Gripping the material between pairs of rollers S232 may thus include a calibration step: calibrating the grip. Calibrating the grip functions to determine if the actuation of the material actuation is proportional to the actuation of the roller actuation, thereby detecting slippage. Actuation may be a translation metric or velocity metric. Calibrating the grip may include measuring the material translation and measuring the roller effective linear translation on its external surface in contact with the material. Additionally or alternatively, a vision system may be used in tracking actuation of material.

In addition to determining appropriate pressure for the grip, calibrating the grip may point out whether the system and/or method is functioning correctly; for example, whether the grip is too "soft" or too "hard", or if the cutting tool is functioning properly (e.g., if a cutting bit is dull, the cutting bit may exert additional resistance on the material causing the material to "slip"). Calibrating the grip may be performed at any desired time. Examples of potentially useful times include when incorporating a new type of material, or significant changes in machine performance are observed. Calibrating the grip may be implementation specific. In some preferred variations, sensors may be installed such that calibrating the grip is performed continuously or near continuously. Measuring the material actuation may be performed by a camera monitoring the direction of actuation, a pair of visual sensors along the path of actuation or through other means. Measuring the roller velocity may be performed by a rotary encoder on a roller (preferably a freely turning, non-driven roller), by contact sensors alongside the roller, an alternative vision system, or through other suitable sensing systems. In one preferred implementation, calibrating the grip includes measuring the angular velocity of a roller using a rotary sensor and measuring the translational velocity of the material adjacent to the roller using a camera that tracks the material. An alternative implementation involves comparing the angular velocity of a driven roller to that of a non-driven roller that is being moved by material passing under it.

In preferred variations, calibrating the grip additionally includes determining rate of motion and orientation of the material passing through the cutting device. Determining rate of motion and orientation functions to enable the cutting device to have an accurate understanding of the position of the material enabling precise processing of the material. Additionally, determining rate of motion and orientation, enables material to be fed into the cutting device at an angle; either purposefully or accidentally. As described above, the rate of motion is determined by measuring the translational velocity of the material. In one implementation, the orientation of the material is determined by two contact image sensors parallel to the rollers. In another implementation, a camera sensor determines the angle of approach of the material piece thereby determining the orientation.

As discussed previously, gripping the material between pairs of rollers S232 may include increasing or decreasing the pressure between the pairs of rollers to achieve the appropriate pressure. In one variation, at least one set of the rollers is held in place by a spring mechanism wherein tightening (or loosening), the spring mechanism increases (or decreases) the pressure between pairs of rollers. Preferably, the spring mechanism is connected to at least one set of rollers. In one preferred example, the spring mechanism is connected to the set of rollers that is not driven (not independently actuating), while the second set of rollers are fixed in place and may be connected to a system or device that drives them. In this example, block S232 may additionally include changing the spring tension. Changing the spring tension between the two sets of rollers may be controlled in a multitude of ways. In one variation the spring tension is controlled by an active actuator, wherein increasing (or decreasing) the spring tension includes actuating at least one set of the two sets of rollers towards (or away from) each other. Other methods may be additionally or alternatively implemented to change the spring tension. Examples of changing tension between the two sets of rollers may include: implementing hydraulics pressure, and manually tightening the springs.

Block S234, which includes driving at least one roller that is gripping the material, functions to rotate a roller and thus actuate the material in the direction of rotation through friction between the roller and the material. In one preferred variation a driving system is connected to at least one roller in each roller feed subsystem. The process of driving at least one roller S224 may include driving at least one roller unidirectionally, but preferably includes driving at least one roller bidirectionally.

Block S240, which includes actuating a cutting tool, functions to move the cutting tool to a certain position alongside the material such that the cutting tool can process (e.g., cut) the material at that location. Actuating a cutting tool S230 preferably includes controlling activation of the cutting tool to process the material S242. Actuation of a cutting tool S240 preferably occurs along at least one axis orthogonal to the direction of material actuation. That is, for material traveling in an 'x' direction (e.g., along the length dimension of the material) through the cutting device, actuation of the cutting tool occurs in the 'y' and/or 'z' direction. In one variation, actuating a cutting tool S240 occurs in the 'y' direction, i.e., along the face/width of the material. In another variation actuating a cutting tool S240 occurs in the 'z' direction (i.e., along the height/thickness of the material). In another preferred variation, the cutting tool actuates at least along both axes that are orthogonal to the material actuation (i.e., along both the 'y' and 'z' directions). In one preferred example, actuating a cutting tool S240 includes actuating the cutting tool in both the 'y' and 'z' direction and further includes rotating the head of the cutting tool. Rotating the head of the cutting tool may function to enable the cutting tool to make an angled approach on the material (e.g., angled cuts on the material, such as to create a shim for a staircase). For an automated process, actuating a cutting tool S230 preferably occurs as prescribed from retrieving material processing specifications S210.

Block S242, which includes controlling activation of the cutting tool to process the material, functions to implement the functionality of the cutting tool (e.g., cutting, milling, engraving, marking, etc.). In some preferred variations, the head of the cutting tool may be switched to change the functionality of the tool. Examples of other cutting tool heads include: a mill bit, drill head, saw head, mechanical etcher, laser etcher, writing device, painting device). As discussed in this method, the cutting tool head will refer to a cutting device with the action of "cutting", but may alternatively refer to any other type of cutting tool device with appropriate form of action replacing cutting (e.g., drilling). Controlling activation of the cutting tool may involve control of any variable of the tool such as tool bit speed, laser intensity or beam size, and the like.

In most preferred variations, controlling activation of the cutting tool to process the material S242 is concurrent to actuating a cutting tool S240 and concurrent to actuating the material between pairs of rollers S230. Actuation of both material and cutting tool enables using the cutting tool to cut the material in a variety of ways. In preferred implementations, both actuating the cutting tool S240 and actuating the material between pairs of rollers S230 occur as prescribed by retrieving material processing specifications in block S210. Actuation of the material back and forth may enable multiple passes for using the cutting tool over the material.

As using the cutting tool S242 over the material (e.g., for cutting) may generate much greater resistance, in preferred variations, each set of rollers has multiple rollers to improve grip and stability. Actuating the material between pairs of rollers preferably S242 includes actuating the material between at least two pairs of rollers. In preferred implementations for a cutting device each set of rollers comprises two roller pairs prior to the cutting tool and two roller pairs after the cutting tool (8 rollers total), thus enabling actuating the material between at least two pairs of rollers while using the cutting tool S230 along the edges of the material as well as other regions of the material.

Synchronized control of blocks S230, and S240 may be applied in marking the material. In addition to processing/shaping the material, distinctive marks may be made into the material to help identify the material. In the preferred automated implementation, the mark may be specified from in material processing specifications.

In some preferred variations, synchronized control of blocks S230 and S240 may enable the device to make angled cuts and/or shave regions of the material. Angled cuts may be particularly useful for the use case of creating shimming for an uneven staircase. Angled cuts may additionally be useful for creating boards or panels for other uneven surfaces.

Controlling activation of the cutting tool S242 preferably occurs concurrent to gripping the material between pairs of rollers S210 and preferably concurrent to calibrating the grip S212. Calibrating the grip S212 concurrent to using the cutting tool S232 enables detection of other problems that may occur during the method. Calibrating the grip S212 during, using the cutting tool may detect that a cutting bit is dull (e.g., if slippage occurs during using the cutting tool while slippage does not occur when not using the cutting tool). Detecting a dull drill bit may lead to increasing the cutting speed and slowing material actuation speed in minor cases and possibly stopping the process until the drill bit is changed. In either case, the user may be notified that maintenance is required.

The systems and methods of the embodiments may be embodied and/or implemented at least in part or whole as a machine or processing device that is configured to receive a computer-readable medium storing computer-readable instructions to perform the operations described above. The instructions can be executed by computer-executable components integrated with an application, applet, host, server, network, website, communication service, communication interface, hardware/firmware/software elements of a user computer or mobile device, wristband, smartphone, or any suitable combination thereof. Other systems and methods of the embodiment can be embodied and/or implemented at least in part as a machine configured to receive a computer-readable medium storing computer-readable instructions. The instructions can be executed by computer-executable components integrated with apparatuses and networks of the type described above. The computer-readable medium can be stored on any suitable computer readable media such as RAMs, ROMs, flash memory, EEPROMs, optical devices (CD or DVD), hard drives, floppy drives, or any suitable device. The computer-executable component can be a processor, but any suitable dedicated hardware device can (alternatively or additionally) execute the instructions.

As a person skilled in the art will recognize from the previous detailed description and from the figures and claims, modifications and changes can be made to the embodiments of the invention without departing from the scope of this invention as defined in the following claims.

We claim:

1. A method for automating paneled construction comprising:
    collecting a multi-dimensional point cloud measurement of at least one construction structure that includes at least one surface, comprising at a measurement device, scanning the construction structure and thereby collecting the multi-dimensional point cloud measurement, wherein scanning the construction structure comprises, for a given position on a stair, scanning a tread surface of the stair and scanning a riser surface of the stair, wherein the measurement device is a laser scanning measurement device, and wherein the multi-dimensional point cloud measurement is a two or more dimensional point cloud measurement defining a perimeter of at least one surface of the construction structure;
    generating a construction plan from the multi-dimensional point cloud measurement, wherein the construction plan defines an assembly arrangement of a set of parts;
    from the construction plan, automatically generating a cut list for a subset of parts;
    communicating the cut list to a cutting device; and
    at the cutting device, cutting a set of materials according to the cut list.

2. The method of claim 1, wherein the assembly arrangement characterizes placement of parts to cover the construction structure; and wherein generating the construction plan further comprises generating the assembly arrangement that defines an arrangement of a set of paneling parts that satisfies design conditions.

3. The method of claim 1, wherein the construction structure includes at least a tread surface and a riser surface for one stair; and wherein generating a construction plan defines dimensions and assembly arrangement of stair tread parts, riser parts, and nosing parts; and wherein the cut list specifies cutting instructions for non-standard parts in the set of stair tread parts, riser parts, and nosing parts.

4. The method of claim 1, wherein the construction structure includes a base flooring surface; and wherein generating a construction plan defines dimensions and assembly arrangement of flooring planks; and wherein the cut list specifies cutting instructions for non-standard flooring planks.

5. The method of claim 1, wherein scanning the construction structure to collect the multi-dimensional point cloud measurement comprises collecting a plurality of point cloud measurements of subregions of a first surface of the construction structure and unifying the plurality of point cloud measurements into a single point cloud measurement of the first surface.

6. The method of claim 1, wherein the measurement device is a coordinate measurement machine arm.

7. The method of claim 1, further comprising, sensing environment conditions at the measurement device; collecting a present condition of the set of materials; modeling material changes from the present condition to the environment conditions; and augmenting parameters of the cut list according to the material changes; wherein environmental conditions include at least temperature and humidity.

8. The method of claim 1, wherein scanning the construction structure comprises scanning three dimensional surface elevations at a plurality of points on the construction surface; wherein the cut list defines at least one part with a shim surface; and wherein cutting the set of materials comprises cutting at least one part with the shim surface.

9. The method of claim 8, wherein cutting the material comprises translating position of material along one horizontal axis and translating a cutting tool perpendicularly; and varying elevation of the cutting tool in coordination with horizontal translation thereby promoting surface cuts on the material.

10. The method of claim 1, assigning an identifier for each part; and wherein cutting the set of materials comprises marking the material with an identifier assigned to a corresponding part.

11. The method of claim 10, at an assembly user interface, receiving a part identifier input and rendering a graphic indicating position in the assembly arrangement for a part assigned the part identifier input.

12. The method of claim 1, wherein cutting material is cut by a cutting device with three linear degrees of freedom when cutting material.

13. The method of claim 1, wherein cutting material is cut by a continuous material fed cutting device.

14. The method of claim 13, wherein cutting material with the continuous material-fed cutting device comprises retrieving material from an input to a material feed system; translating material position along a first defined axis within the material feed system and translating a cutting tool along a second defined axis that is perpendicular to the first axis; and actuating a cutting tool along a third dimension normal to the first defined axis and second defined axis.

15. The method of claim 14, further comprising feeding uncut materials into a bed of the cutting device and ejecting cut materials through an output upon finishing cutting of the material.

16. The method of claim 15, wherein the material is tongue and grooved planks.

17. A system for a customizable paneling construction comprising:

a measuring device, wherein the measuring device is configured to collecting a multi-dimensional point cloud measurement of at least one construction structure that includes at least one surface;
  a designating system configured to generate a construction plan from the multi-dimensional point cloud measurement, wherein the construction plan defines an assembly arrangement of a set of parts, and, from the construction plan, generate a cut list for a subset of parts
  a cutting device configured to cut a set of materials according to the cut list and
  wherein the at least one construction structure comprises flooring for steps of a staircase, wherein the flooring comprises at least a tread for the top surface of each step and a riser for the front surface of each step.

18. The system of claim 17, wherein the cutting device is a roller-fed cutting device.

19. A method for automating paneled construction comprising:
  collecting a multi-dimensional point cloud measurement of at least one construction structure that includes at least a tread surface and a riser surface for one stair, comprising at a measurement device, scanning the construction structure and thereby collecting the multi-dimensional point cloud measurement, and wherein the multi-dimensional point cloud measurement is a two or more dimensional point cloud measurement defining a perimeter of at least one surface of the construction structure;
  generating a construction plan from the multi-dimensional point cloud measurement, wherein the construction plan defines an assembly arrangement of a set of parts, wherein generating the construction plan defines dimensions and assembly arrangement of stair tread parts, riser parts, and nosing parts;
  from the construction plan, automatically generating a cut list for a subset of parts, wherein the cut list specifies cutting instructions for non-standard parts in the set of stair tread parts, riser parts, and nosing parts;
  communicating the cut list to a cutting device; and
  at the cutting device, cutting a set of materials according to the cut list.

20. A method for automating paneled construction comprising:
  collecting a multi-dimensional point cloud measurement of at least one construction structure that includes at least one surface, comprising at a measurement device, scanning the construction structure and thereby collecting the multi-dimensional point cloud measurement, and wherein the multi-dimensional point cloud measurement is a two or more dimensional point cloud measurement defining a perimeter of at least one surface of the construction structure;
  generating a construction plan from the multi-dimensional point cloud measurement, wherein the construction plan defines an assembly arrangement of a set of parts;
  sensing environment conditions at the measurement device; collecting a present condition of the set of materials, wherein environmental conditions include at least temperature and humidity;
  modeling material changes from the present condition to the environment conditions;
  from the construction plan, automatically generating a cut list for a subset of parts;
  augmenting parameters of the cut list according to the material changes;
  communicating the cut list to a cutting device; and
  at the cutting device, cutting a set of materials according to the cut list.

* * * * *